United States Patent [19]
Imatake et al.

[11] Patent Number: 5,759,424
[45] Date of Patent: Jun. 2, 1998

[54] PLASMA PROCESSING APPARATUS AND PROCESSING METHOD

[75] Inventors: Mitsuko Imatake, Kamakura; Ichiro Sasaki, Yokohama; Toru Otsubo, Fujisawa; Hitoshi Tamura, Yokohama; Takashi Kamimura, Yokosuka, all of Japan

[73] Assignee: Hitachi, Ltd., Tokyo, Japan

[21] Appl. No.: 409,077

[22] Filed: Mar. 22, 1995

[30] Foreign Application Priority Data

| Mar. 24, 1994 | [JP] | Japan | 6-053396 |
| Aug. 8, 1994 | [JP] | Japan | 6-185652 |
| Dec. 27, 1994 | [JP] | Japan | 6-324407 |

[51] Int. Cl.$^6$ .............................. H05H 1/00; G01N 21/00
[52] U.S. Cl. ........................ 216/60; 216/67; 156/345
[58] Field of Search ................ 156/345, 626.1, 156/627.1; 216/60, 59; 204/192.13, 192.33, 298.03, 298.32

[56] References Cited

U.S. PATENT DOCUMENTS

| 4,857,136 | 8/1989 | Zajac | 156/626.1 |
| 5,322,590 | 6/1994 | Koshimizu | 156/345 X |

FOREIGN PATENT DOCUMENTS

| 62-180070 | 8/1987 | Japan . |
| 63-222432 | 9/1988 | Japan . |
| 63-312986 | 12/1988 | Japan . |
| 1-205520 | 8/1989 | Japan . |
| 5-259250 | 10/1993 | Japan . |

*Primary Examiner*—Thi Dang
*Attorney, Agent, or Firm*—Antonelli, Terry, Stout & Kraus, LLP

[57] ABSTRACT

A plasma processing apparatus is provided with a processing chamber having at least a pair of opposing windows to allow observation of the interior thereof, a plasma generation unit for generating a plasma in the processing chamber, a plasma light emission monitoring unit arranged externally of the processing chamber for monitoring the light emission of the plasma through one of the pair of opposing windows, a reference light irradiation unit for irradiating a reference light to the plasma light emission monitoring unit from that window of the pair of opposing windows which is opposite to the plasma light emission monitoring unit through the pair of opposing windows, and a control for controlling a plasma processing state of the substrate to be processed by comparing the data on the light emission of the plasma monitored by the plasma light emission unit and the reference light.

14 Claims, 20 Drawing Sheets

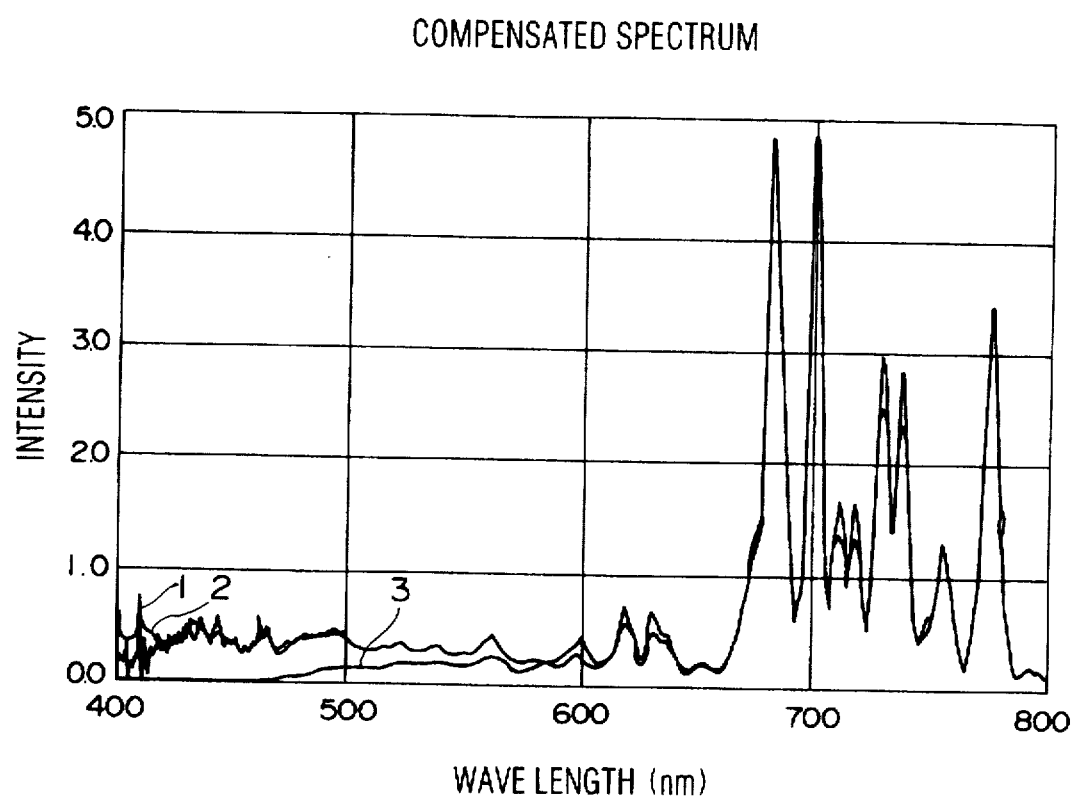

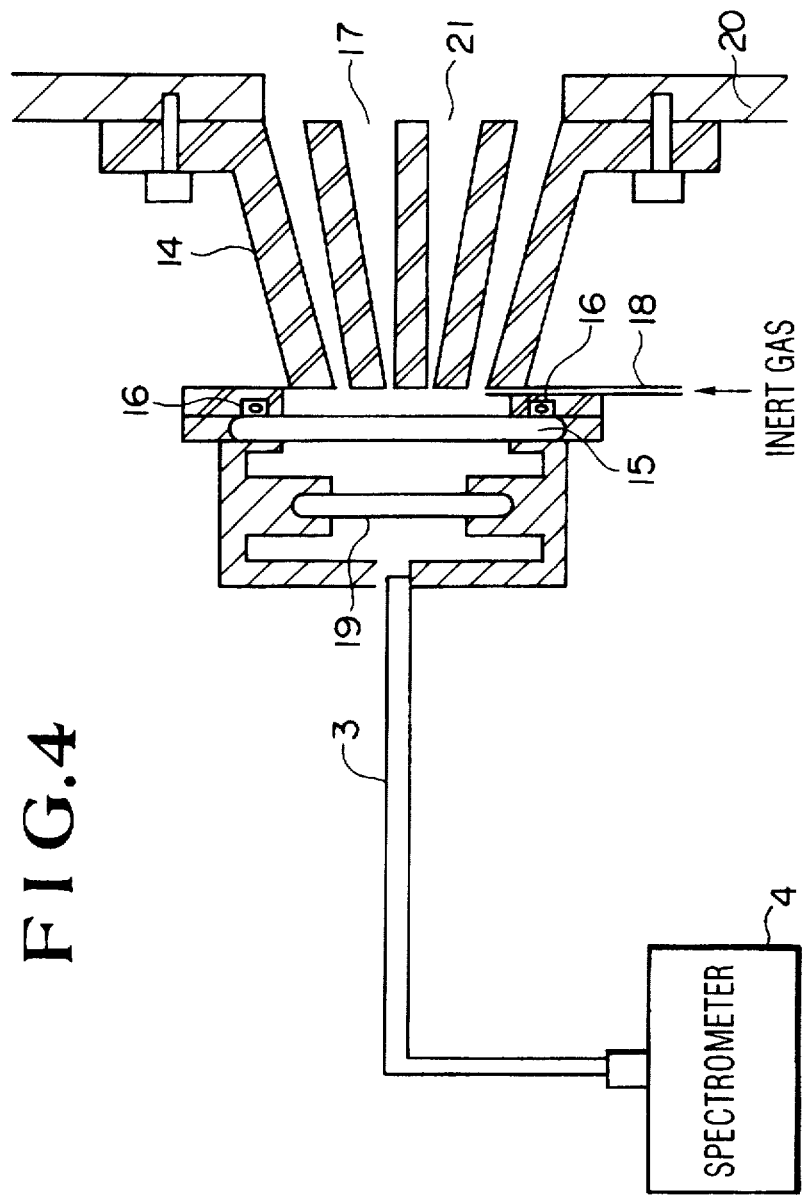

F I G.18
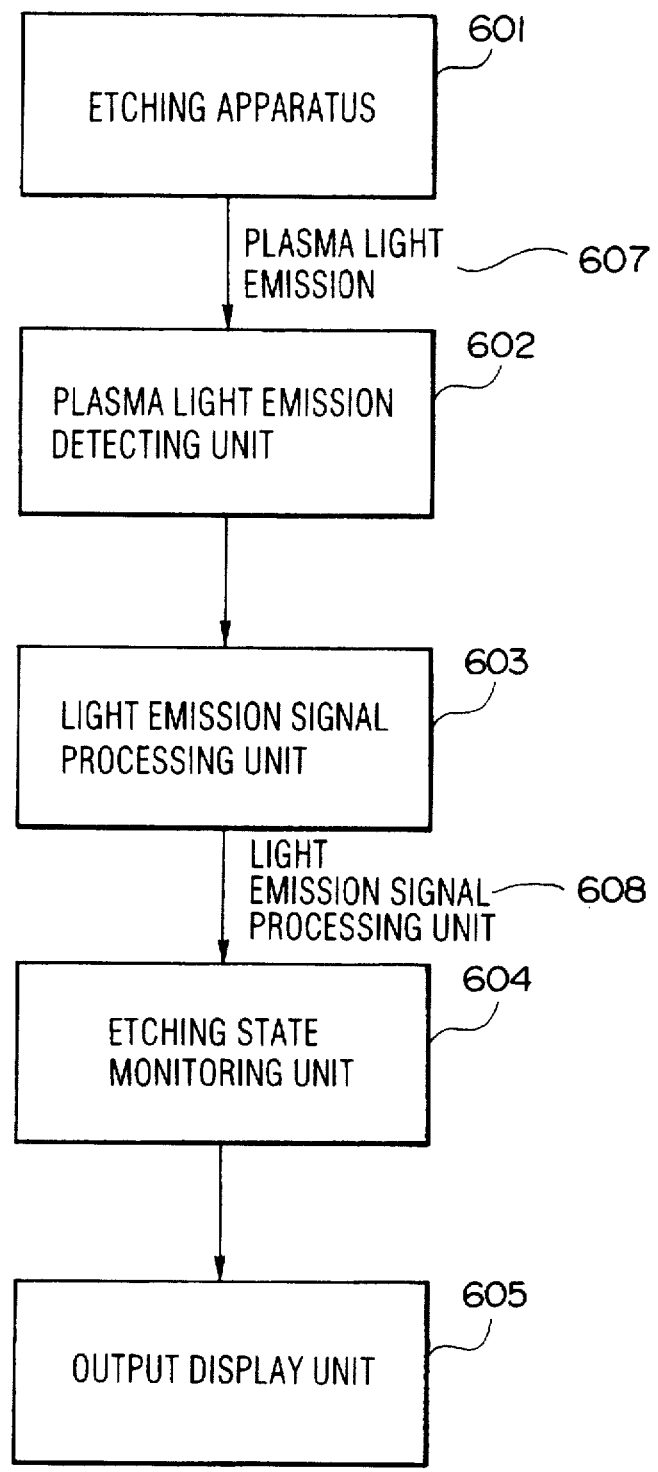

F I G. 20 A
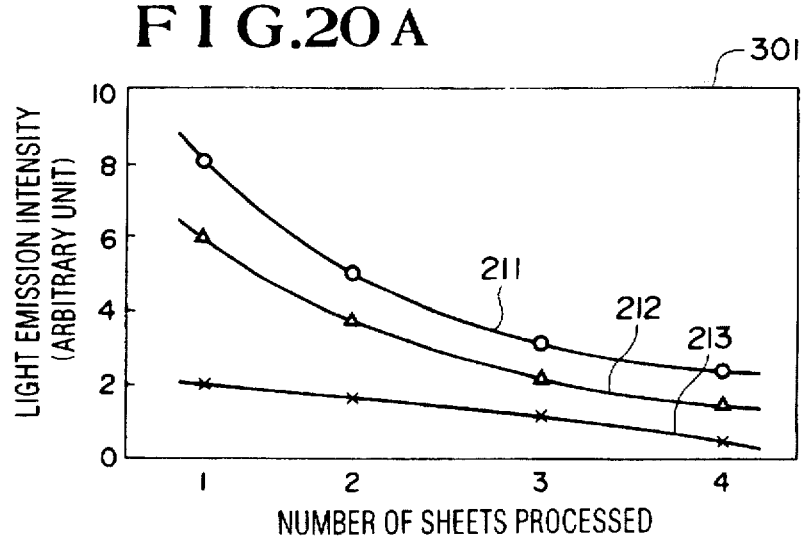
F I G. 20 B
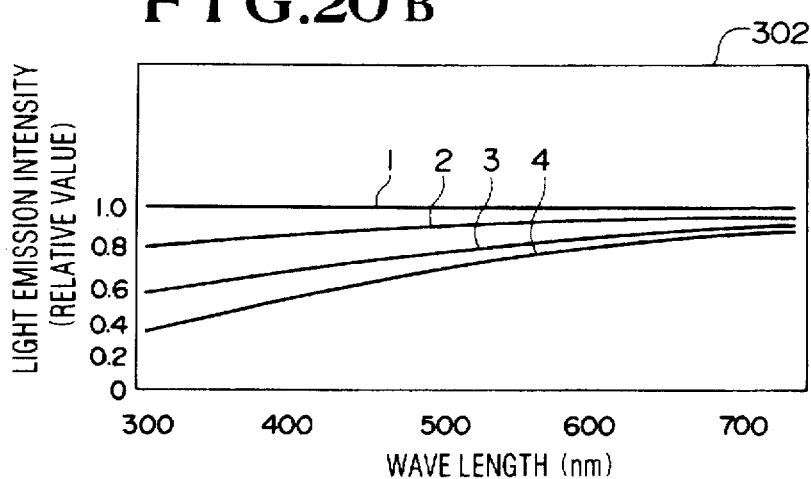
F I G. 20 C
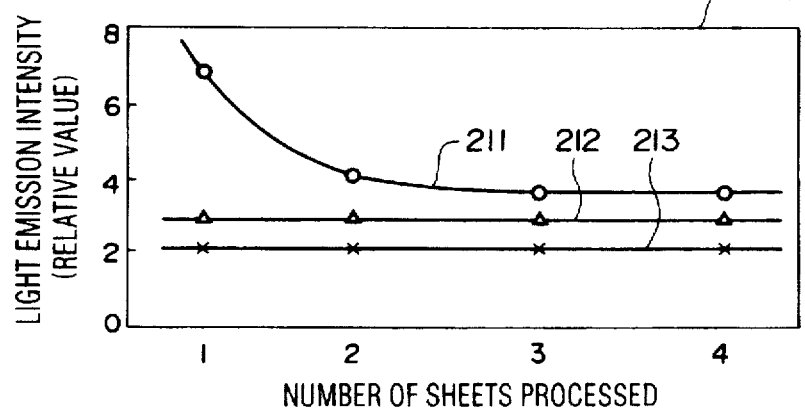

| k | THE PROBABILITY OF NORMAL RANGE |
|---|---|
| 1.0 | 68.27 % |
| 2.0 | 95.45 % |
| 3.0 | 99.73 % |

PLASMA PROCESSING APPARATUS AND PROCESSING METHOD

BACKGROUND OF THE INVENTION

The present invention relates to a plasma processing apparatus for processing a substrate such as a semiconductor device by using a plasma generated in vacuum, such as a dry etching process, a plasma CVD process or a sputter film forming process.

In a plasma processing apparatus such as a dry etching apparatus for processing a semiconductor device by using a plasma, processing gas is introduced into a plasma processing chamber (hereinafter simply referred to as a processing chamber) in a vacuum environment to generate a plasma and highly chemically reactable ions or radicals (neutral activate seeds) are produced by the ionization or the dissociation of the processing gas. Those active particles physically or chemically act to etch off a desired area of a film on a semiconductor substrate to form a device pattern. As means for monitoring the state of the etching process, a plasma light emission spectrometer has been widely used because it can monitor many factors which affect to an etching characteristic such as an active seed level, a reaction product level and a leak level while it does not affect to the plasma.

As prior art monitoring methods which use the plasma light emission spectrometer, the methods disclosed in JP-A-4-212414 and JP-A-61-67227 have been proposed.

JP-A-4-212414 discloses a plasma processing apparatus which on-line controls controllable parameters to attain a plasma state which results in an intended process, by spectrum data of a secondary ray due to a plasma light emission or an external incident light, an electric potential of a substrate or an electrode placed in the plasma, or spectrum data of an infrared ray transmitted through a substrate.

In the plasma processing apparatus disclosed in JP-A-4-212414, in order to attain the above control, a database indicating correlation between a process condition, the spectrum data or the electrical potential and a predetermined value of the process result is stored in a control computer of the apparatus.

The plasma processing apparatus of JP-A-61-61-67227 discloses a method for detecting an error during the etching from different light emission intensities by using a plasma light emission measuring apparatus which senses a plasma light emission by a photo-sensor through a window formed in a plasma processing chamber and continuously measures the light emission intensity of the plasma to detect any abnormal light emission intensity.

As the integration density of an LSI rises, a high technology is required to process it. It is important to improve a performance of a processing apparatus for conducting a high precision process as well as to maintain the performance of the processing apparatus over an extended period to prevent failure from occurring in order to improve the productivity. Considering an etching apparatus of the processing apparatus which plasmanizes a processing gas in a vacuum container to form a pattern on a surface of a wafer, a resist which is a mask for a pattern is decomposed during the etching process to produce an organic compound, which is deposited on an inner wall of a processing chamber or a metal which is a material to be etched (aluminum, molybdenum or tungsten) is deposited as a film on the inner wall of the processing chamber. Those deposits, when they contact to the plasma, generate gas by the action with the ions in the plasma or the temperate rise of the wall surface of the processing chamber, or the state of entry of a microwave into the processing chamber is changed by the deposition of the metal film. As a result, the plasma state in the processing chamber changes. Since the etching process is conducted by the plasma, the etching characteristic is also changed by the change of the state of plasma. Further, an 0-ring for hermetic sealing is deteriorated by the etching gas and small leakage occurs and the state of plasma changes. Namely, when the etching apparatus is operated over an extended period, the aging of the etching characteristic occurs and finally a test condition is not cleared and it leads to the occurrence of failure. Further, the deposit on the inner wall of the processing chamber, when it reaches certain thickness, is scraped off to produce foreign materials. This is also true for other plasma processing apparatus (CVD apparatus and sputtering apparatus) and it is a hurdle to maintain the performance stable over the extended period.

In the plasma etching apparatus disclosed in JP-A-63-42124, the state of plasma during the etching process is monitored by the light emission and the monitored result is used only to monitor the end of etching. Namely, since the material to be etched (aluminum) is also present in the plasma by the etching reaction during the etching, the intensity of the light emitted thereby (the attenuation inherent to the material) is monitored and the end of etching is detected when the intensity of the light reaches zero. Accordingly, a time and an etching rate necessary to etch one wafer are obtained. However, even if those value change, the process condition is not modified. Further, means to prevent the occurrence of failure is not provided.

SUMMARY OF THE INVENTION

It is an object of the present invention to provide a plasma processing apparatus having a monitor device for monitoring a plasma light emission without being affected by the change in a transmission characteristic of a sampling window.

It is another object of the present invention to provide a plasma processing apparatus which can control a plasma characteristic and maintain the plasma processing characteristic by monitoring the plasma characteristic over the extended period.

It is other object of the present invention to provide a plasma processing apparatus which can prevent contamination of a substrate to be processed due to contamination in a processing chamber by monitoring a state of contamination in the processing chamber and can determine a proper maintenance (such as cleaning) time.

A problem encountered in the spectrometering of the plasma light emission is that a window for detecting the plasma light emission is changed with time by the etching process.

Namely, since a reaction product produced in the etching is deposited as a film on the surface of the window of the processing chamber, a transmissivity to the plasma light emission changes. Further, when the window of the processing chamber is directly exposed to the plasma, unevenness is created on the surface of the window inside the processing chamber by a sputtering action by the plasma, and the light emitted by the plasma and reached to the window is reflected randomly so that the amount of light transmitted through the window reduces and the light intensity to the spectrometer reduces accordingly. When the light intensity detected by the spectrometer changes by those factors, it is not possible to determine whether the light intensity of the plasma light emission itself has changed or the transmissivity of the window has changed. In the prior art plasma processing apparatus which analyzes and monitors the light emission, no attention is paid to the aging of the transmissivity of the plasma light emission through the plasma monitoring window by the etching action during the plasma processing and a constant monitor output cannot be attained for the same amount of plasma light emission. Thus, it is difficult to attain stable plasma processing result.

Further, the monitoring of the plasma in the prior art does not monitor wide conditions relating to the etching characteristic but the contents of the monitor are limited to the detection of the termination point and the detection of the fault.

Further, when the etching process is repeated, the reaction product is deposited on the inner side of the processing chamber and this causes the change in the plasma state. As the plasma state changes, the etching reaction condition changes and the proper etching process cannot be attained if the etching condition is kept constant. Accordingly, in order to attain stable etching process, it is necessary to frequently clean the reaction chamber to keep a condition under which the constant plasma can always be generated. In the prior art, however, the monitored data on the amount of plasma light emission is used only for the determination of the stability of the plasma and the etching characteristic and no attention is paid to the contamination in the processing chamber. As a result, it is not possible to determine exact timing of cleaning of the processing chamber and the contamination of the substrate due to the contamination in the processing chamber cannot be prevented.

It is an object of the present invention to solve the above problem.

In order to achieve the above object, in the plasma processing method of the present invention, the light emission of the plasma generated in the plasma processing chamber and a light having a known spectrum emitted from a light source externally of the plasma processing chamber and transmitted through the interior of the plasma processing chamber are detected, a difference between the light emission of the plasma and the light of the known spectrum is determined, and the internal state of the plasma processing chamber is determined based on the difference between the spectrums.

Further, the present invention comprises a processing chamber having a substrate to be processed arranged therein and kept at a predetermined pressure by processing gas and having at least one pair of opposing windows to allow the observation of the inside, plasma generation means for generating a plasma in the processing chamber kept at the predetermined pressure by the processing gas, plasma light emission monitoring means externally of the processing chamber for monitoring the light emission of the plasma through one of the pair of opposing windows, reference light illumination means externally of the processing chamber for projecting a reference light to the plasma light emission monitoring means from the other side of the pair of opposing windows to the plasma light emission monitoring means through the pair of opposing windows, and control means for controlling the state of the plasma processing of the substrate to be processed in accordance with the data of the plasma light emission and the reference data monitored by the plasma light emission monitoring means.

The reaction product is deposited on the surface of the window of the etching processing chamber or the unevenness is created thereon by the impact of the ions from the plasma. As a result, when the plasma light emission passes through the window, a waveform component inherent to the material forming the deposit is absorbed by the amount determined by the amount of deposit or it is randomly reflected on the inner surface of the window so that the light intensity is lowered.

In order to quantitatively grasp the situation, a separate light (reference light) is directed externally of the processing chamber and it is transmitted through the processing chamber and emitted out of the processing chamber. It is detected by a spectrometer and compared with the original reference light (which is not transmitted through the processing chamber) so that the transmissivity for each wavelength is determined. Then, the reference light is extinguished and the spectrum of the plasma light emission is detected and it is divided by the transmissivity determined for each wavelength by using the reference light so that the detection error due to the affect of the window is compensated and the plasma light emission can be exactly determined.

On the other hand, the electrons and the ions are lost by the collision to the wall surface in the processing chamber and the loss is supplied by the ionization, and the plasma is maintained by the balance of those. Accordingly, when the contact area to the wall surface increases relative to the volume of the plasma, the loss increases and the plasma cannot be maintained. As a result, in a tubular container which is sufficiently long relative to a diameter, the plasma cannot be maintained. By using this property of the plasma, an article having a plurality of elongated holes having a sufficiently small diameter is place inside the window to prevent the contact of the plasma to the window.

In this case, the light from the plasma can reach the window. However, when the light enters from the window while it is reflected by the inner walls of the holes, the spectrum is affected by the reflection. Thus, the inner walls of the holes are threaded to cause random reflection so that such light (reflected light) is not introduced. Further, inert gas such as Ar is flown from the window to the holes toward the plasma processing chamber to prevent the reaction product in the plasma from being deposited on the window by the diffusion.

By the use of the compensation means for the plasma light emission spectrum or the plasma shielding means, the plasma light emission spectrum can be measured without being affected by the contamination or the cutting of the window. By using this result, the etching characteristic can be monitored in the following manner.

When the plasma occurs and the etching process is started, the reaction product of the etching reaction on the surface of the wafer appears in the plasma and it emits light. The intensity of the light emission depends on a supply rate of the reaction product into the plasma, that is, an etching rate and also a plasma density. Accordingly, the etching rate can be monitored based on the light emission spectrum. FIG. 5B shows an example of aging change of the light emission intensity of the reaction product. A waveform comprises four straight line components. A light emission intensity of tungsten (W) which is the reaction product corresponds to a light emission intensity from a point A to a point B while the etching progresses on the entire surface of the wafer, and it is substantially constant. As the etching is completed, the light emission intensity of W abruptly decreases. On the other hand, when there is a distribution in the etching rate of W in the wafer surface (a fast etching rate area and a slow etching area), the area of completion of the etching gradually spreads and the light emission intensity of the reaction product gradually decreases as shown by a change from the point B to a point C. At a point D, the plasma discharge in the processing chamber is terminated. Accordingly, A difference between the etching rates of W in the wafer surface, that is, the uniformity can be monitored by a change in time of the light emission intensity of the reaction product W.

The uniformity of the etching process is defined by the following formula:

$$\text{Uniformity (\%)} = \frac{1}{2} \cdot \frac{(\text{maximum etching rate} - \text{minimum etching rate})}{\text{averag etching rate}} \times 100 \quad (1)$$

When a wiring film is to be etched, a change in time of the light emission intensity of a material to be etched is considered (FIG. 5B). It is assumed that a start time point of the termination of etching is $t_1$, a time point of the termination of the etching for the entire area is $t_2$, a film thickness of W is d (nm), a maximum etching rate of the wafer is $d/t_1$ (nm/s), a minimum etching rate is $d/t_2$ (nm/s) and an average etching rate is $\frac{1}{2} \times (d/t_1 + d/t_2)$ (nm). They are substituted in the above formula to get the following formula:

$$\text{Uniformity (\%)} = \frac{t_2 - t_1}{t_2 + t_1} \times 100 \quad (2)$$

Accordingly, the uniformity can be calculated from $t_1$ and $t_2$.

FIG. 6A shows an actual waveform. As shown, since the termination points of the etching of the wafer are not uniform, the fluctuation of the light emission intensity is large between a point $S_1$ and a point $S_2$, and points having a substantially equal radius of curvature are included in the curve. Accordingly, it is difficult to determine whether the point $S_1$ is to be extracted or the point $S_2$ is to be extracted as an extreme value of two-state differentiation, and thus it is difficult to extract a value of X coordinate of an inflection point of the two-stage differentiation as $t_1$ and $t_2$.

Thus, the start time point $t_1$ of the termination of etching and the time point $t_2$ of the termination of etching for the entire surface are extracted by a combination of the two-stage differentiation process after the filtering of the waveform and the segment approximation of the entire waveform.

In the filtering process, an intermediate value filter which eliminates noises while leaving significant information such as edges is used. FIG. 6B shows a waveform of the segment approximation after the filtering of the actual waveform, and a waveform of the two-stage differentiation after the segment approximation of the actual waveform. A peak point 8 when the waveform is two-stage differentiated and the point 5 of the termination of etching for the entire surface match between the two waveforms. Thus, the point 5 is defined as the point $S_2$ of the termination of etching for the entire surface.

The start time point 1 of the termination of etching is deviated from a valley point 7 when the waveform is two-stage differentiated. Between the point 1 and constituent point of the approximated segments, a deviation along the X coordinate is larger than that at the point of the termination of etching. Thus, the segments are traced from the point 5 in the opposite direction to the progress of time and a start point of a segment having a gradient larger than a predetermined threshold is defined as the start time point $t_1$ of the termination of etching. In this manner, the start time point of the termination of etching and the time point of the termination of etching for the entire surface can be stably detected.

The start time point $t_1$ of the termination of etching and the time point $t_2$ of the termination of etching for the entire surface are substituted in the formula (2) to calculate the uniformity of the etching.

When an O-ring is exposed to the etching gas and deteriorated, the sealing effect is lost and a leakage phenomenon in which atmosphere leaks into the processing chamber occurs. Nitrogen and oxygen penetrated into the processing chamber by the leakage are plasmanized in the processing chamber and emit lights at inherent wavelengths. Accordingly, as for the leakage, attention is paid to the wavelength of the light emission of nitrogen and the wavelength of the light emission of oxygen, and when the light emission intensity is larger than normal, the leakage is detected.

The plasma is controlled by a pressure and a plasma generation power as described below.

When a light emission level in a short wave-length area is lower than a standard level, it is considered that a proportion of electrons having a high energy is low, that is, an electron temperature is low. Thus, in this case, the pressure is reduced to rise the electron temperature. On the other hand, when a level in a long wave-length area is low, the pressure is increased. When the overall level of the plasma spectrum is low, it is considered that the light emission level is lowered because the plasma density is low. In this case, the plasma generation power is increased to increase the plasma density. On the other hand, when the overall level of the plasma spectrum is high, the plasma generation power is lowered to reduce the plasma density.

In addition, any abnormal light emission peak in the entire waveform may be detected to monitor the abnormal state of the etching.

In this manner, the setting conditions such as the pressure and the plasma generation power are controlled and the leakage is monitored to prevent the light emission spectrum of the plasma from deviating from the reference, and the etching characteristic can be maintained constant.

As described above, the window of the processing chamber is contaminated as the etching is repeated. The contamination occurs not only on the window but in the other areas of the processing chamber as well. Accordingly, the contamination in the processing chamber can be estimated by monitoring the transmission characteristic of the reference window.

The prior art disclosed in JP-A-63-42124 only monitors the termination of the etching process and it does not check whether the result of the etching process (dimension of pattern cross-section, shape and uniformity in the wafer surface) meets a test requirement or not. Thus, even if the characteristic of the processing apparatus changes and the etching process does not meet the test requirement, the process is proceeded under the same condition resulting in fault products. As discussed in connection with the prior art, since the processing characteristic of the etching processing chamber changes with time, it is necessary to exactly test the result for each process. In the present invention, the process status is monitored for each substrate etched and the result is informed to the processing apparatus so that the processing apparatus corrects the processing conditions to conduct the process properly, or when the correction of the process condition is not feasible, stops the process so that the etching characteristic is maintained constant and the monitoring of the etching is attained for preventing the occurrence of failure.

The above problem may be resolved without specifying a cause of the aging change of the process characteristic. Since not only the process characteristic but the plasma state change with time, the change of plasma has been studied in detail. A composition of the discharging gas changes by the discharge of new gas from a film of the reaction product deposited on the inner wall of the processing chamber, and the plasma changes. Further, a power (effective discharge power) which the plasma absorbs changes by the absorption (for example, dielectric loss) of a portion of the supplied discharge power by the film of the reaction product. Alternatively, when a metal wiring film such as aluminum is to be etched, the thin film of the metal is deposited to the inner wall of the processing chamber as the film of the reaction product and a portion of the power is reflected and is not absorbed by the plasma in this case, the effective discharge power changes. The temperature of the inner wall of the processing chamber rises by the discharge and the amount of discharge of gas from the deposited film and the amount of secondary electron emission change, and the plasma changes.

Those plasma changes are observed as a change in the light emission spectrum. Accordingly, by previously storing in a database characteristics of the changes of the light emission spectrum by the change of the discharge power and the characteristics of the changes of the light emission spectrum by the change of the gas composition, a cause of the change of the change of the plasma may be identified by comparing the change of the actual spectrum with the database. If the cause of the change is controllable one such as the discharge power or the pressure, it is corrected to restore the plasma to the original state. Namely, it is fed back to the process conditions (power, pressure, etc.) so that the plasma is stably maintained and the process characteristic is also stabilized. If the cause of the change is uncontrollable one such as the gas discharge from the deposit on the inner wall, an alarm is issued and the process is stopped to prevent the occurrence of failure products. Further, it can also indicate a proper maintenance timing.

FIG. 11 shows a spectrum of a light emission spectrum of a chlorine plasma when the processing apparatus is new and has not been used before, and FIG. 12 shows a spectrum of the chlorine plasma when the processing apparatus has been used for an extended time period. The processing apparatus uses a microwave ECR system. From the comparison of those figures, a difference between the spectrums is recognized and a cause of the difference may be inferred as follows. FIG. 13 shows a change of the spectrum when only the microwave power is changed in the same processing apparatus. An abscissa represents a wave-length, and an ordinate represents a spectrum divided by a center condition spectrum, in percent (%). FIGS. 14 and 15 show charts similar to that of FIG. 13 when only the pressure and only the chlorine flow rate are changed, respectively. As seen from those figures, the manner of change of the spectrum is completely different depending on whether the power changes or the pressure changes. Namely, it is possible to infer based on the manner of change of the spectrum which one of the discharge conditions has changed, and what degree. Accordingly, by previously determining the changes of the spectrum by the change of the controllable conditions (discharge conditions), the cause of the change of the actual spectrum, that is, the change of the plasma state can be inferred.

In accordance with the present invention, since the correction means or the plasma shielding means is provided in the sampling window, the affect to the aging change of the light transmissivity of the sampling window by the plasma is reduced, and the spectrum of the reaction product in the plasma can be exactly monitored in a stable manner. By controlling the etching process conditions by exactly monitoring the spectrum under the stable state, the stable etching process can be maintained over an extended period of time.

In accordance with the present invention, since the wafer etching process of the plasma etching apparatus is continuously monitored and the process characteristic is maintained constant, the occurrence of fault product is prevented.

BRIEF DESCRIPTION OF THE DRAWINGS

FIG. 3 shows a result of a spectrum compensation process.

FIG. 4 shows a sectional view of the shielding means.

FIG. 18 shows a flow chart of signal processing of the present invention.

FIGS. 20A, 20B and 20C show changes of the light emission intensity.

DESCRIPTION OF THE PREFERRED EMBODIMENTS

Figure 1:
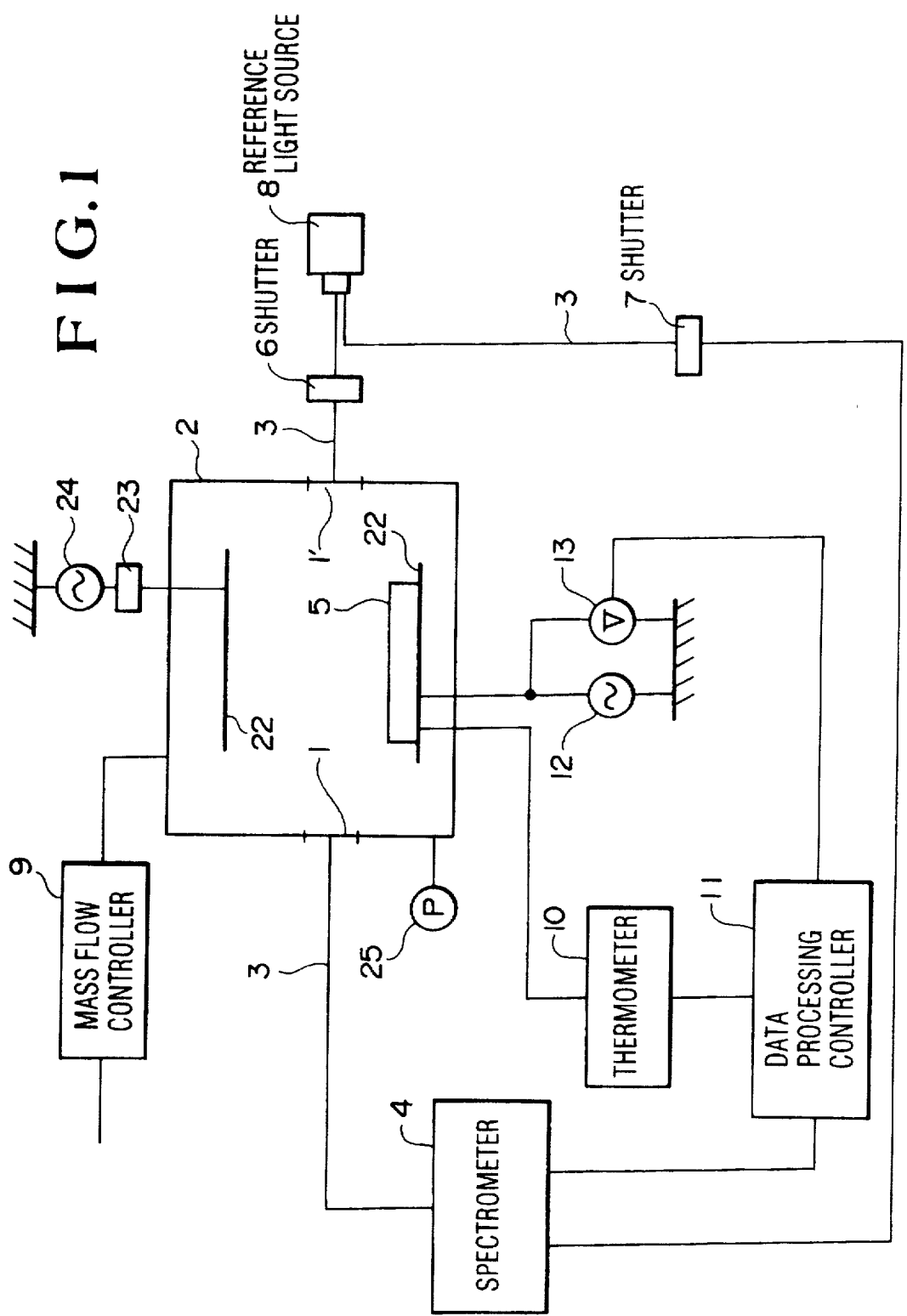
FIG. 1 shows a block diagram of an overall configuration of the present invention.

Referring to FIG. 1, an embodiment of a method for compensating a spectrum by quantitatively grasping the contamination and the cut of the window is explained.

FIG. 1 shows an overall view of an apparatus having compensation processing means for the plasma light emission spectrum.

Numeral 2 denotes an etching processing chamber into which etching reaction gas is introduced. The gas is controlled by a mass flow controller 9. Parallel plates 22 are provided in the processing chamber 2. A power is introduced into the processing chamber 2 by a plasma generation power supply 24. A phase shift between the plasma generation power supply 24 and the parallel plates 22 is adjusted by a matching circuit 23. An RF power supply 12 for controlling ions is arranged below the parallel plates 22. A thermometer 10 for a wafer is provided below the parallel plates 22. Data form a voltmeter 13, the thermometer 10 and a spectrometer 4 are supplied to a data processing controller 11.

A wafer 5 for generating the plasma is etched. A sampling window 1 is provided in the processing chamber 2. A light from a reference light source 8 is introduced into the sampling window 1 through a quartz fiber 3. A shutter 6 is provided between the reference light source 8 and the sampling window 1. A light is introduced to the spectrometer 4 directly from the reference light source 8 through the quartz fiber. A shutter 7 is provided between the spectrometer 4 and the reference light source 8.

An operation of the present apparatus is described. The processing chamber is evacuated to vacuum and the etching gas regulated by the mass flow controller 9 is flown to maintain at a predetermined pressure. An output of the plasma generation power supply 24 is applied to the upper electrode of the parallel plates 22 through the matching circuit 23 to generate the plasma and conduct the etching.

The etching reaction on the surface of the wafer 5 may be considered as a chemical reaction of the active seeds in the plasma and the material to be etched. Ions are introduced into the wafer 5 by applying a bias voltage by the RF power source 12 so that the reaction proceeds.

The quartz fiber 3 is provided on the two sampling windows 1, one of which is connected to the spectrometer 4 and the other is connected to the reference light source 8 through the shutter 6. The quartz fiber 3 is connected from the reference light source 8 to the spectrometer 4 through the shutter 7.

The shutter 7 is opened and the reference light is directed to the spectrometer from the reference light source 8 and the spectrum thereof is sampled. The shutter 7 is closed and the shutter 6 is opened, and the spectrum of the reference light transmitted through the sampling window 1 two times is sampled by the spectrometer 4. The reaction product produced by the etching process is deposited in film form on the sampling window 1 and the unevenness is created on the surface of the window by the sputtering action by the plasma so that the light from the plasma to the sampling window is randomly reflected and the amount of light directed to the spectrometer 4 reduces. As a result, the transmissivity changes.

The changed light emission intensity for each wavelength of the spectrum of the reference light sampled through the sampling window 1 by opening the shutter 6 is compensated by the spectrum of the inherent reference light. The transmissivity through the sampling window for each waveform is determined. Then, the shutter 6 is closed and the reference light source 8 is extinguished and the plasma is generated in the processing chamber 2. The spectrum of the plasma light emission in the processing chamber 2 is compensated by the transmissivity determined by using the reference light through the sampling window 1 to determine the inherent plasma light emission. A result of compensation is shown in FIG. 3.

In FIG. 3, [1] represents a true value of the plasma, [2] represents a compensation value of the plasma spectrum, and [3] represents the plasma spectrum transmitted through the sampling window having the transmission characteristic thereof changed.

Figure 17:
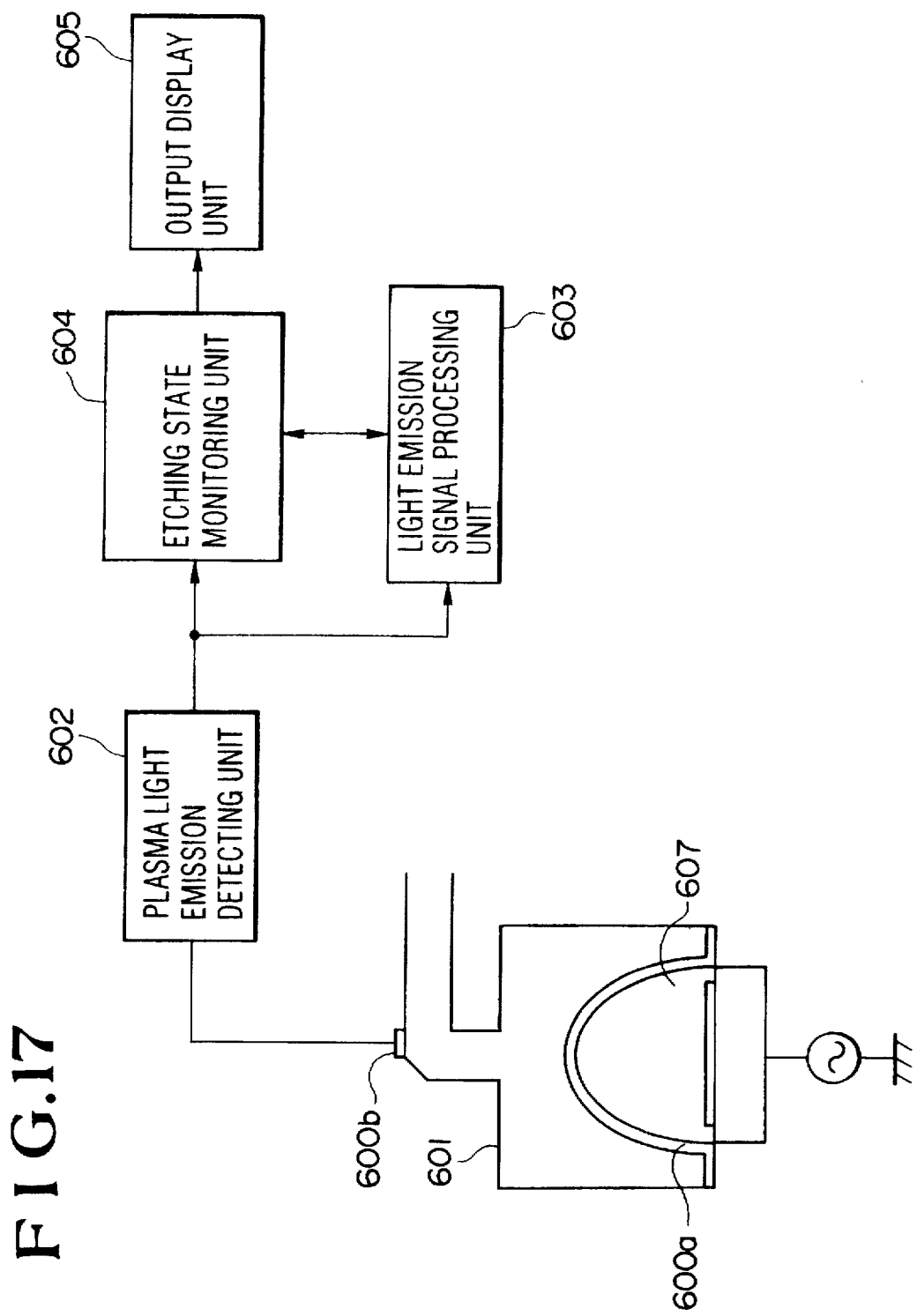
FIG. 17 shows a block diagram of other embodiment of the present invention.

Other embodiment of the compensation of the plasma light emission spectrum is described. FIG. 17 shows a block diagram of a monitoring apparatus when the present invention is applied to the etching apparatus. FIG. 18 shows a flow chart of the monitor signal processing. In FIG. 17, the etching apparatus 601 comprises a bell jar chamber 600a and a sampling window 600b. The etching monitoring apparatus comprises a plasma light emission detection unit 602, a light emission signal processing unit 603, an etching state monitoring unit 604 and an output display unit 605. Operations of the respective units are briefly explained. The plasma light emission detection unit 602 derives light emission spectrum data from the plasma light emission 607 of the etching unit 601 and sends it to the light emission signal processing unit 603 and the etching state monitoring unit 604. The light emission signal processing unit 603 compensates the light emission spectrum data by the reference light emission spectrum data and sends the compensated light emission spectrum data 608 to the etching state monitoring unit 604. The compensation method will be described in detail herein-later. The etching state monitoring unit 604 estimates the quantity and state of the reaction product in the processing chamber of the etching apparatus and the state of deterioration of components based on the light emission spectrum data 608 and sends the information such as the maintenance of the apparatus and the error alarm of the etching process to the output display unit 605 which displays the data. It also determines the setting conditions such as the processing pressure, the gas flow rate and the plasma generation power to compensate a deviation from a predetermined etching process characteristic and sends them to the etching apparatus 601 as feedback signals. The etching apparatus 601 changes the setting conditions in accordance with the feedback signals to correct the deviation from the predetermined etching characteristic.

Figure 19A:
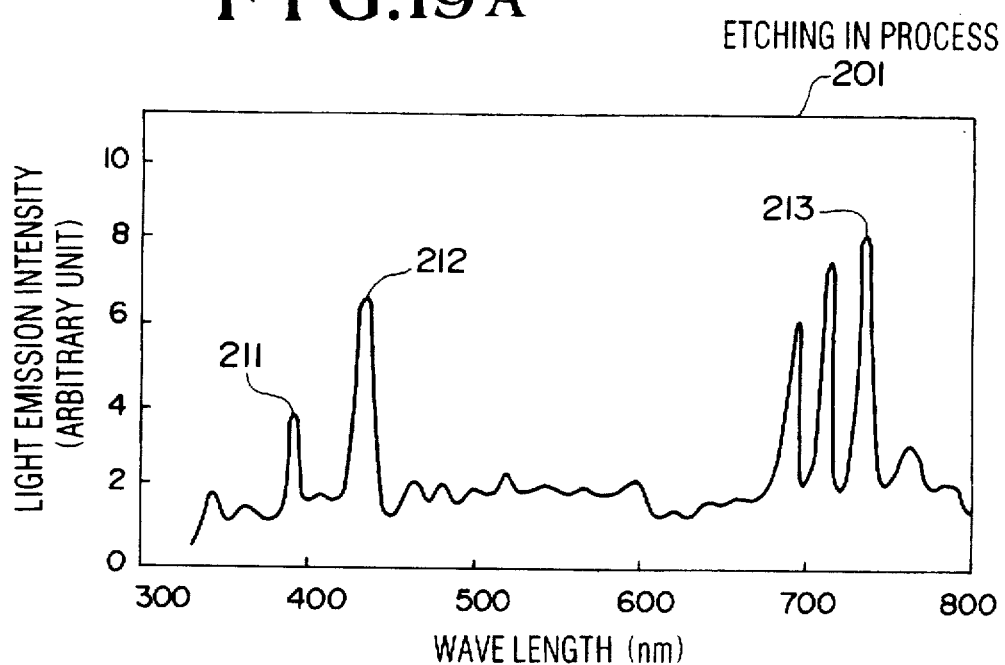
FIGS. 19A and 19B show light emission spectrums.
Figure 19B:
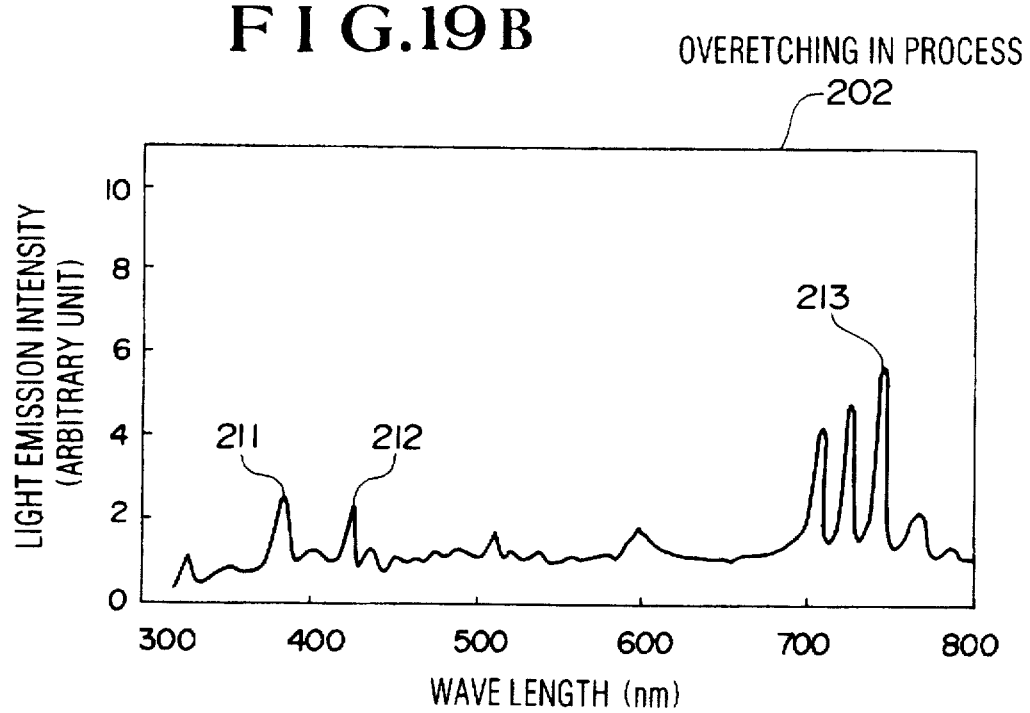

Referring to FIGS. 19A, 19B, 20A, 20B and 20C, the compensation of the light emission spectrum data is explained. FIGS. 19A and 19B show the light emission spectrum in the etching. Numeral 201 represents during etching, and numeral 202 represents during over-etching. During the etching, spectrum peaks 211, 212 and 213 change, but during the over-etching, they do not substantially change because the etching reaction does not substantially proceed during the over-etching. On the other hand, many reaction products are produced during the etching and they deposit on the inner wall of the bell jar chamber so that the light emission spectrum intensity is reduced as a total. The deposit increases as the number of times of process increases, and the change of the intensity of the light emission spectrum is shown by 301 in FIG. 20A. The three lines 301 in FIG. 20A show the change of the peaks of the spectrum peaks 211, 212 and 213 in FIGS. 19A and 19B by the light emission intensities (relative values). From the figure, it is seen that all of the three spectrum peaks reduce as the number of times of process increases. The light emission spectrum during the over-etching is sampled for each wafer and the spectrum intensities of the wafer #2 to #4 are divided by the intensity of the wafer #1. The result is shown by 302. Numerals 1 to 4 represent the number of wafers processed. By compensating the light emission intensity 301 by the waveform characteristic 302, the affect of the reduction of the light intensity by the deposition to the bell jar chamber can be eliminated. Numeral 302 in FIG. 20B represents the result of the compensation of 302. While the spectrum peaks 211, 212 and 213 appear as all reduced in 301, only 211 reduces and other two do not change as seen from 303.

In this manner, the affect of the reduction of the light intensity by the deposition to the bell jar chamber is eliminated by the compensation in the signal processing unit so that stable monitor data is derived.

The above explanation for the etching is equally applicable to a process which utilizes a plasma process.

In accordance with the present invention, since the etching process state of the wafer of the plasma etching apparatus is monitored in process to maintain the process characteristic constant, the occurrence of the failure is prevented.

Figure 16:
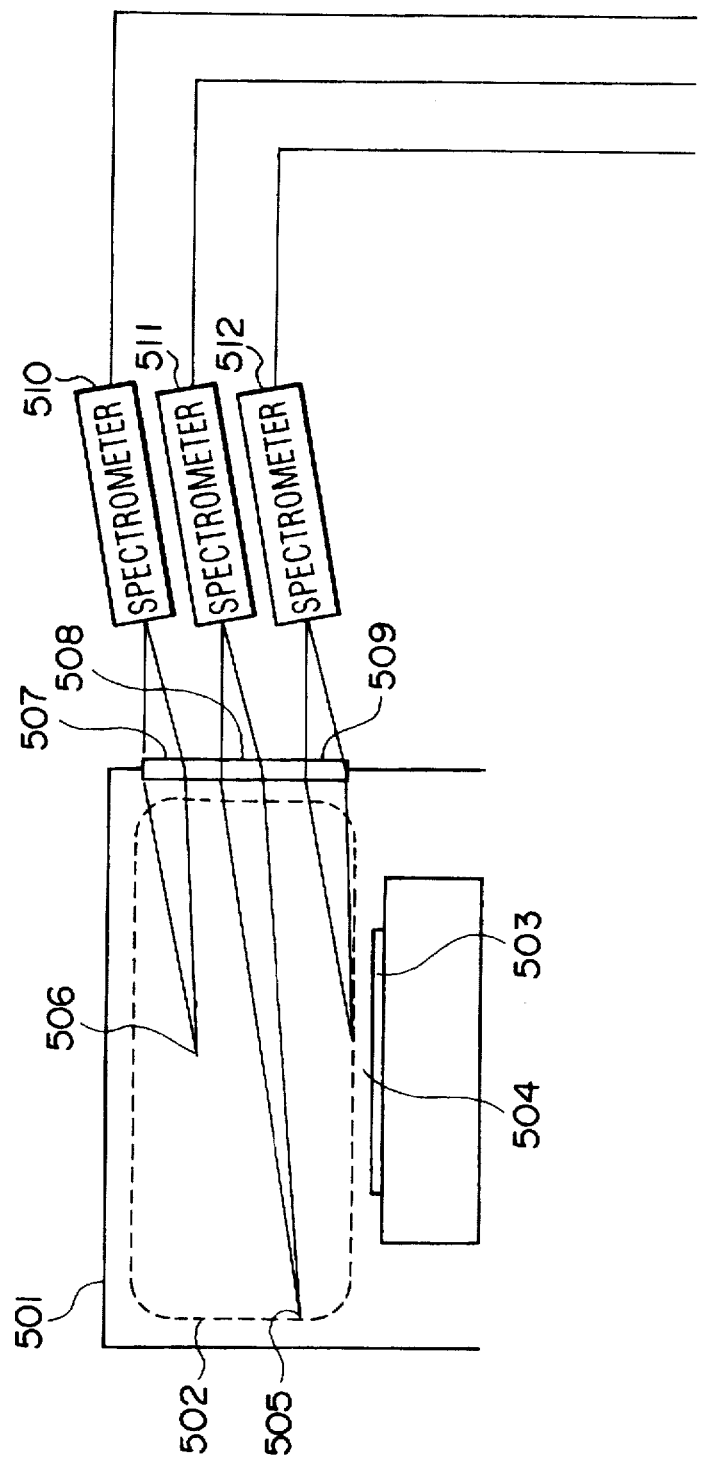
FIG. 16 shows a sectional view of the plasma etching apparatus of the present invention.

Referring to FIG. 16, a method for observing a light emission spectra of a plurality of specified portions of the plasma is explained. FIG. 16 shows a sectional view of a plasma etching apparatus. In FIG. 16, an etching process chamber 501 is maintained at a predetermined pressure by a vacuum evacuation system, not shown and an etching gas introduction unit, not shown. A discharge power is supplied by a discharge power supply unit, not shown to generate a plasma 502 to etch a wafer 503. A light emission from the plasma is not uniform but the light emission of an etching reaction product is strong at a position 504 near the wafer and the light emission of the discharge gas from the deposit on the wall surface is strong at a position 505 near the wall surface of the etching processing chamber 501. Further, the light emission of the etching gas per se is strong at a center position 506 of the plasma 502. Thus, when the light emission of the plasma is observed, the difference among the light emission positions can be discriminated by a sampling optical system provided on the wall surface of the etching processing chamber 501. In FIG. 16, the optical system 507 is focused to the center position 506 of the plasma 502 and the light emission at only this area is introduced to a spectrometer 510. Similarly, an optical system 508 introduces only the light emission of the point 505 near the wall surface of the etching processing chamber 501 to a spectrometer 511, and an optical system 509 introduces only the light emission at the point 504 near the wafer 503 to a spectrometer 512.

Monitoring of an etching characteristic of a wafer (W wafer) having tungsten (W) film formed thereon is now explained.

When the etching process is started, tungsten hexafluoride ($WF_6$) is produced by the etching reaction on the wafer surface and it is separated to fluorine (F) and tungsten (W) which emit lights. A light emission intensity depends on the amount of supply of the reaction product into the plasma, that is, an etching rate and also depends on a plasma density. Accordingly, the etching rate can be monitored based on the light emission spectrum.

Figure 5A:
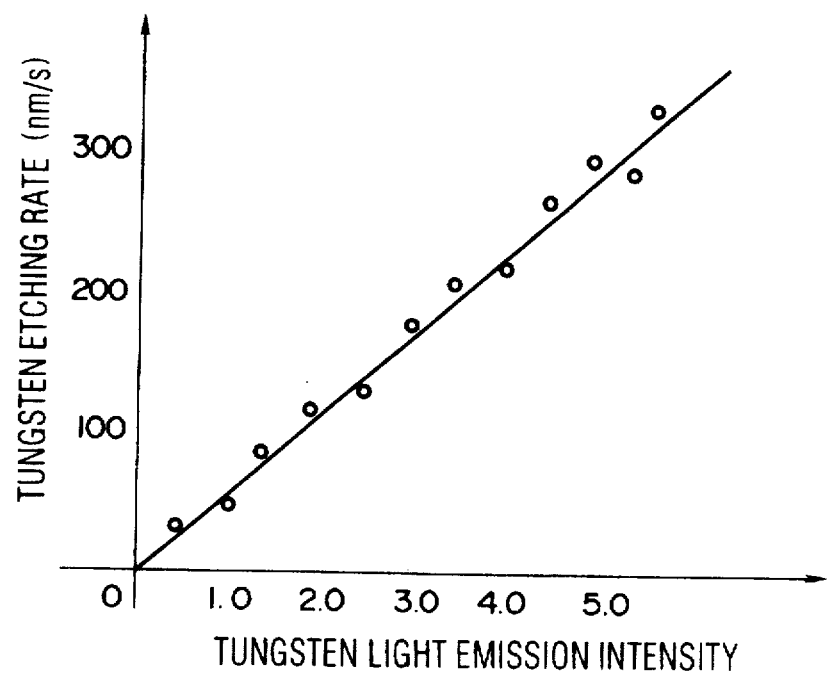
FIG. 5A shows a relation between a tungsten light emission intensity and an etching rate.
Figure 5B:
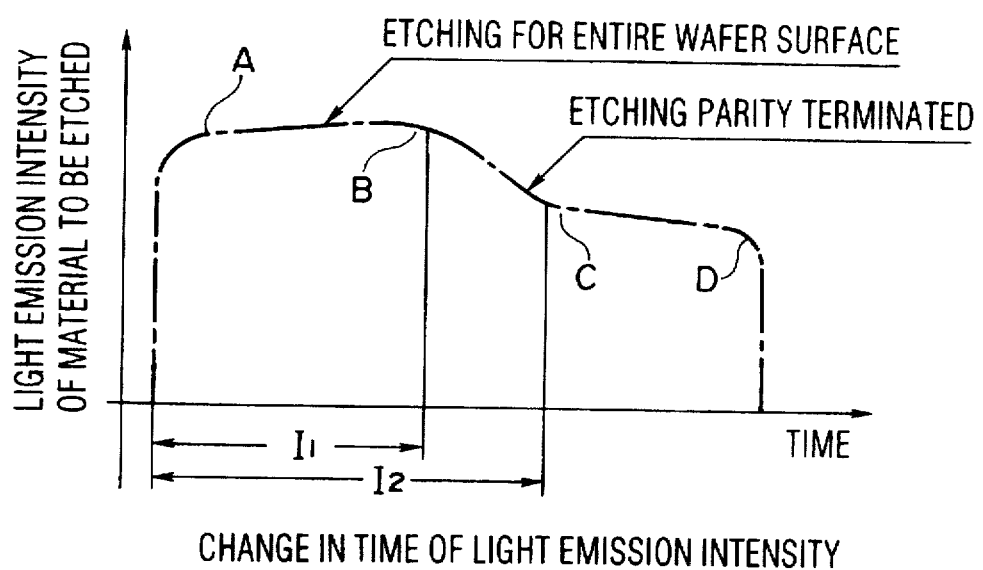
FIG. 5B shows a change in time of the light emission intensity.

A relation between the light emission intensity of F and the etching rate of the W wafer is shown in FIG. 5A. FIG. 2B shows an aging change of the light emission intensity of W which is a reaction product. The light emission intensity of W which is the reaction product corresponds to the light emission intensity from [A] to [B] while the etching progresses on the entire surface of the wafer and it is substantially constant. Upon the termination of the etching, the light emission intensity of W abruptly decreases. On the other hand, when there is a difference in the etching rate (a fast area and a slow area) on the W wafer surface, the area of the termination of the etching is gradually expanded and the light emission intensity of the reaction product gradually decreases in accordance with the change from [B] to [C]. At [D], the plasma discharge in the processing chamber is terminated. Accordingly, the difference between etching rates, that is, the uniformity on the W wafer surface can be monitored by the change in time of the light emission intensity of the reaction product W.

Figure 6A:
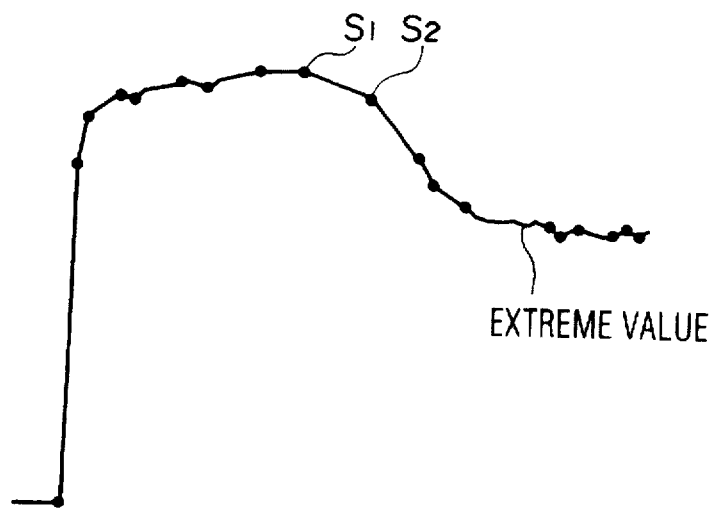
FIGS. 6A and 6B show changes in time of the plasma light emission intensity during the etching process.
Figure 6B:
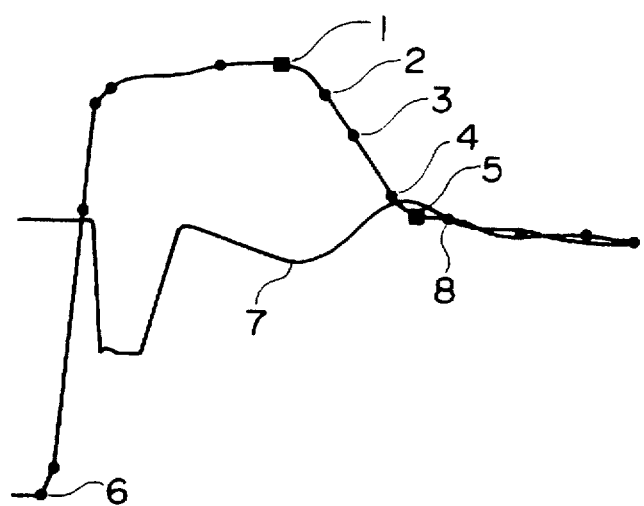
Figure 8:
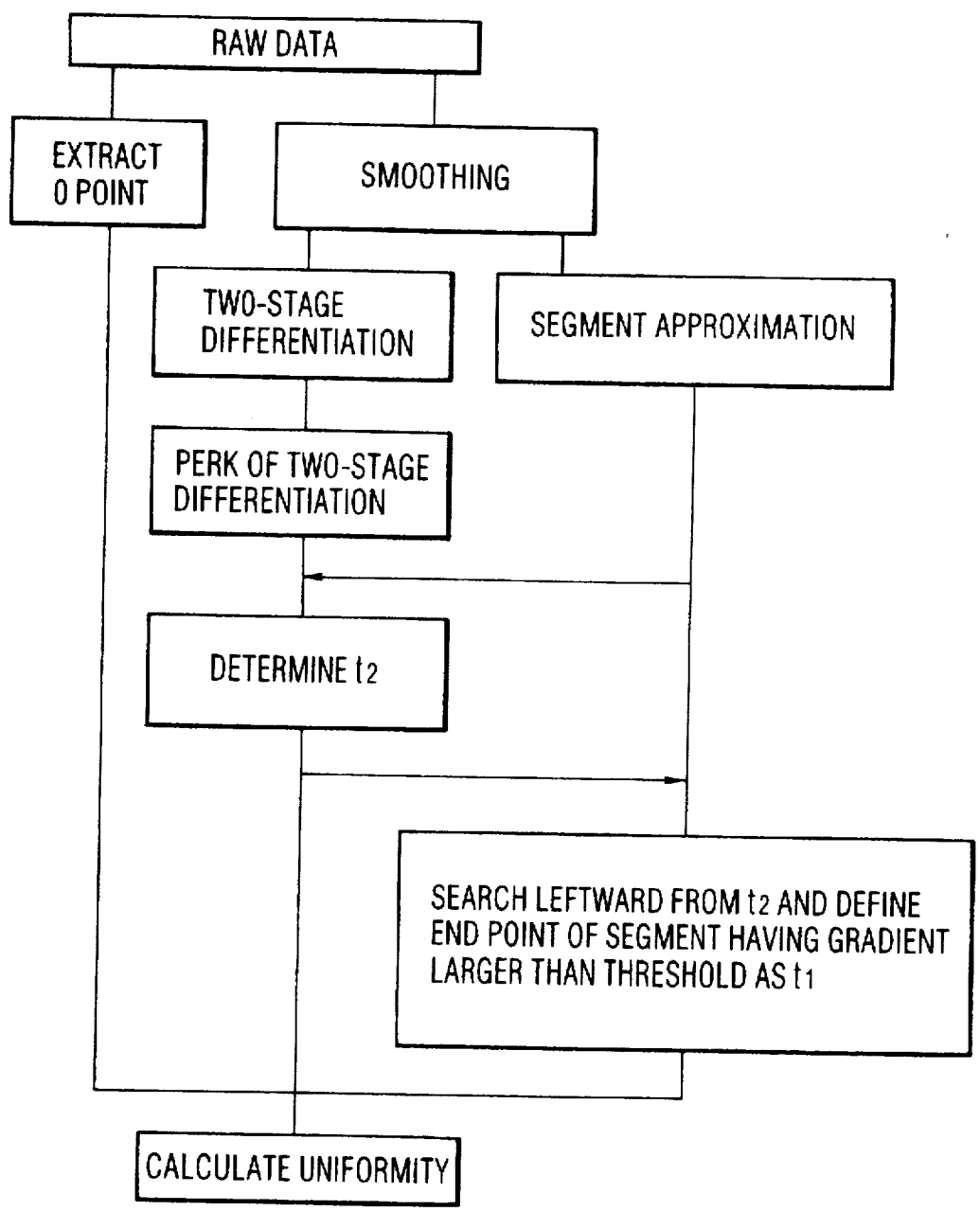
FIG. 8 shows a uniformity detection algorithm.

An algorithm for detecting the uniformity is shown in FIG. 8. A change of the light emission intensity of the plasma in the actual etching process is shown in FIG. 6A. It is sampled at 60 points, for 12 seconds at a 2-second interval. FIG. 6B shows segment approximation graphs (lines 1 to 6) of the data sampled in FIG. 6A and filtered in accordance with the algorithm shown in FIG. 8 and a result (lines 7 and 8) of two-stage differentiation of the segment approximation of the sampled data without filtering process.

The detected data is first filtered by an intermediate value filter having a width 3 (in which an intermediate value is extracted from data sampled at three contiguous points). After the sampled data is filtered, it is segment-approximated, and a start point of a first segment having a gradient larger than unity as viewed in a direction of the time axis of the segment is defined as a start point (point 0) of the etching (point 6 in FIG. 6B).

In FIG. 6B, A peak point 8 after the two-stage differentiation of the waveform and a point 5 at which the etching for the entire wafer surface is completed match in time. Thus, the point 5 is defined as a point (t2) of the completion of etching for the entire surface. An etching start point 1 is deviated from a valley point 7 of the two-stage differentiated waveform. Each of the constituent points of the segment by the segment-approximation to the point 1 has a larger deviation along the X coordinate from the point of termination of etching of the entire surface. Thus, the segment graph is traced from the point 5 in the opposite direction to the time progress and a segment having a gradient larger than a threshold is defined as the start point and the point 1 is detected as the start point (t1) of the termination of the etching. Thus, the start point (t1) of the termination of the etching and the point (t2) of the termination of the etching for the entire surface can be stably detected. By substituting them to the uniformity detection formula (formula (2)), the uniformity may be detected safely.

The etching reaction on the W wafer surface is considered as a chemical reaction of the active seed F in the plasma and a material to be etched, and the reaction progresses by the supply of an energy of F ions directed to the W wafer. A temperature of the W wafer also affects to the reaction. Accordingly, the etching reaction on the pattern side wall depends on the temperature of the W wafer and the energy of the ions supplied to the side wall, and it is determined by a bias voltage.

As a result, in FIG. 1, the amount of etching on the pattern side wall, that is, the dimensional precision may be monitored by measuring the temperature of the W wafer by the thermometer 10 and the bias voltage by the voltmeter 13.

When an O-ring is exposed to the etching gas, it is deteriorated and the sealing property is damaged and a leakage may occur in which atmosphere is introduced into the processing chamber. Nitrogen and oxygen introduced into the processing chamber by the leakage emit lights by the plasma in the processing chamber at a position of light emission characteristic of the nitrogen and a position of a light emission characteristic of the oxygen, respectively. The leakage may be detected when the light emission intensity rises above a normal by noticing each waveform.

As described above, the etching characteristic is deeply related to the spectrum of the plasma light emission.

Accordingly, the etching characteristic may be maintained constant by maintaining the light emission spectrum of the plasma constant.

Figure 7A:
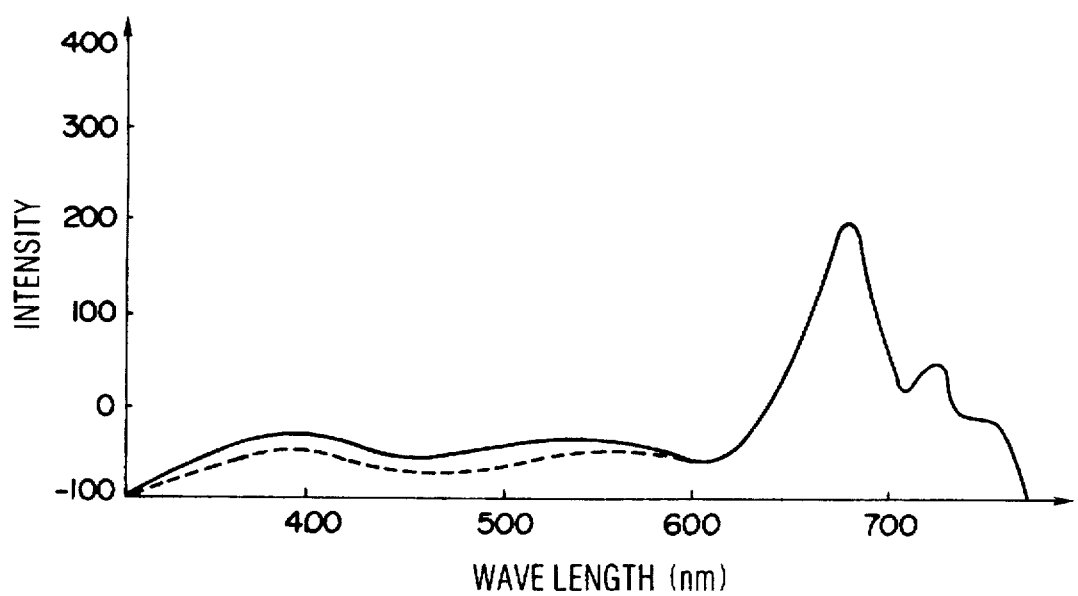
FIGS. 7A and 7B show relations between a plasma light emission wavelength and the light emission intensity.

The plasma may be controlled by a pressure and a plasma generation power as will be described later. First, referring to FIGS. 7A and 7B, the control of the plasma by the pressure is explained. As shown in FIG. 7A, when a light emission level in a short waveform area is lower than a standard level, a proportion of electrons having a high energy is low. Namely, it is considered that an electron temperature is low, in this case, the pressure is lowered to raise the electron temperature.

Figure 7B:
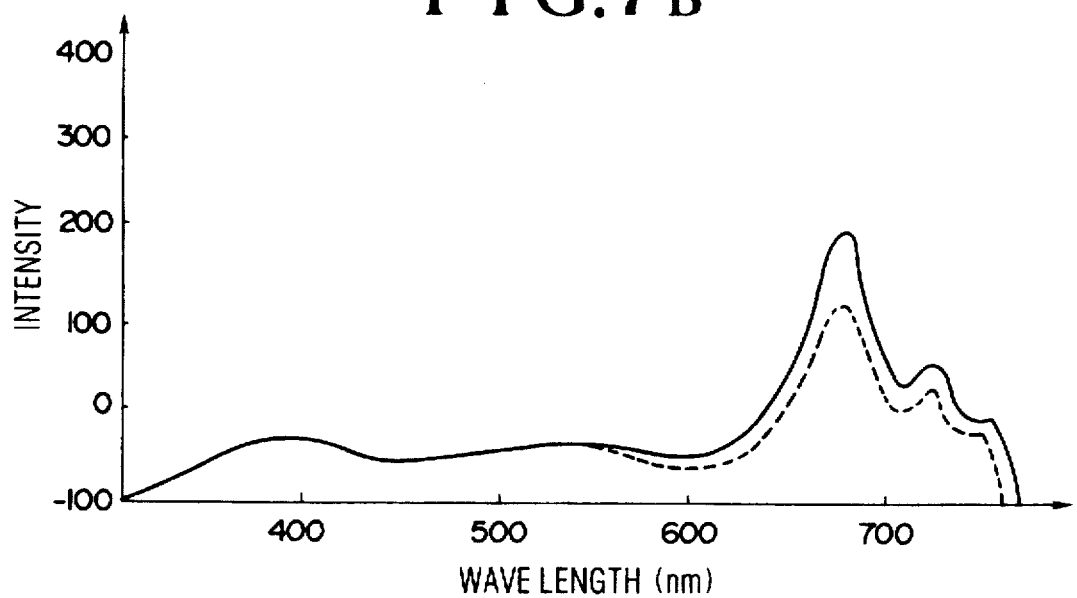

On the other hand, as shown in FIG. 7B, when a level in a long wave-length area is low, the pressure is increased. When an overall plasma spectrum level is low, it is considered that the light emission level is low because the plasma density is low. In this case, the plasma generation power is raised to increase the plasma density. On the other hand, when the overall spectrum level is high, the plasma generation power is lowered to lower the plasma density.

A specific wave-length of the light transmitted through the sampling window is absorbed by the reaction product by the plasma deposited on the sampling window. In addition, the amount of absorption of the specific wave-length changes with the thickness of the deposited film. The composition of the deposit may be identified by the position of the absorption of the wave-length and the amount of deposit may be monitored by the amount of absorption of the spectrum. Accordingly, by monitoring the state of contamination of the window by the change of the transmission characteristic of the sampling window 1, the contamination in the processing chamber may be monitored. The plasma light emission spectrum sampled by the spectrometer 4 and the data from the thermometer 10 which measures the temperature and the voltmeter 13 which measures the RF supply 12 are supplied to the data processing controller 11. The etching characteristic of the wafer 5 is monitored based on the calculation by the data processing controller 11. In addition, the entire waveform is monitored to detect any abnormal peak to detect a foreign and monitor any abnormal state in the etching.

In this manner, the plasma light emission spectrum is prevented from being shifted from the reference of the light emission spectrum of the plasma in a normal etching state. The etching characteristic may be maintained constant by controlling the setting of the mass flow controller 9 and the RF power supply 12 by the data processing controller 11.

Figure 2:
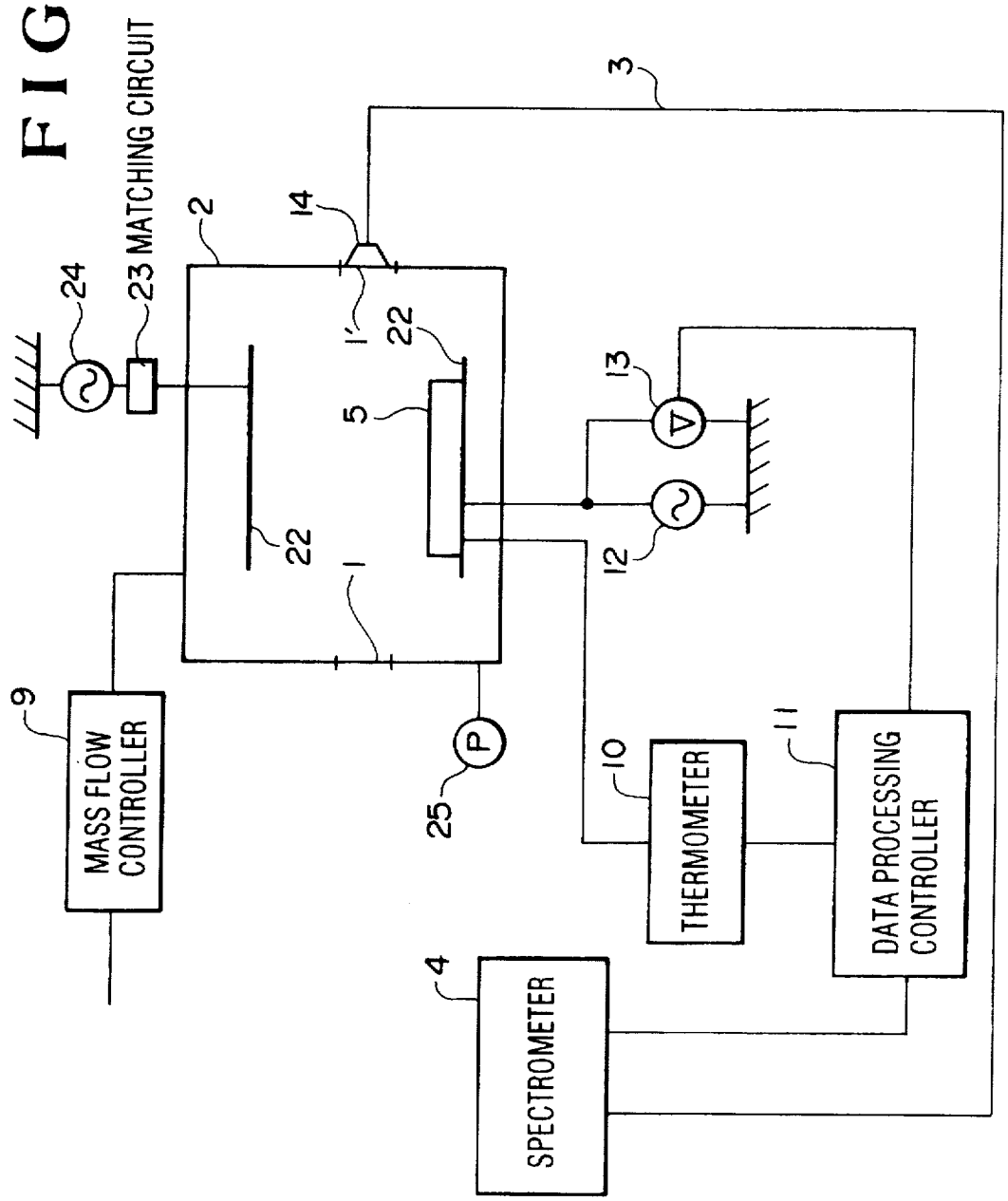
FIG. 2 shows a block diagram of an overall configuration of the present invention which adopts shielding means.

FIG. 2 shows an overall view of the present apparatus having plasma shielding means for the sampling window. A constriction of the present apparatus is now explained. Numeral 2 denotes an etching processing chamber. Reaction gas of the etching is introduced into the chamber 2. The gas is controlled by the mass flow controller 9. Parallel plates 22 are provided in the processing chamber 2. A power is supplied into the processing chamber 2 by the plasma generation power supply 24. A phase shift between the plasma generation power supply 24 and the parallel plates 22 is adjusted by the matching circuit 23. The ion controlling RF power supply 12 is mounted below the parallel plates 22. The thermometer 10 is provided below the parallel plates 22. The data from the voltmeter 13, the thermometer 10 and the spectrometer 4 are supplied to the data processing controller 11.

In this construction, a plasma is first generated to etch the wafer 5. The sampling window 1 is provided in the processing chamber 2. The plasma shielding means 14 is provided in the sampling window 1 and the light is directed to the spectrometer 4 by the quartz fiber 3. A pressure meter 25 is provided in the processing chamber 2.

Referring to FIG. 4, a constriction of the plasma shielding means attached to the sampling window 1 is explained. FIG. 4 shows a sectional view of the plasma shielding means. The plasma shielding means is attached to the sampling window 1 of the processing chamber of FIG. 2. In FIG. 4, a sampling window 21 without a glass plate being mounted is provided in the wall surface 20 of the processing chamber, and a plurality of shields and a glass plate 15 are mounted by a hermetic sealing O-ring 16 to an elongated hole 17. The left side of the glass is at atmosphere and the right side including the interior of the hole 17 is in vacuum. The light emission of the plasma generated in the processing chamber 1 passes through the hole 17 and is transmitted through the glass plate 15, and it is focused by a focusing lens 19 and directed to the spectrometer 4 through the fiber 3.

As described above, the plasma cannot be present in an elongated tubular container.

Thus, when the axial length of the hole 17 is selected to be no smaller than five times of a diameter, the electrons are easy to be lost by the inner wall of the hole 17 so that the plasma cannot enter the hole 17. As a result, the light from the plasma can reach the glass plate 15 but the plasma does not contact to the glass plate 15. A portion of the light from the plasma may reach the glass plate while it is reflected by the inner wall of the hole 17 but the spectrum of such light has been changed by the reflection and hence it is to be removed. By threading the inner wall of the hole 17, the light is attenuated while it repeats the reflection and does not reach the glass. Further, by introducing inert gas such an Ar from a gas nozzle 18 and flowing it into the processing chamber from the glass plate 15 through the hole, the reaction product is prevented from arriving to the glass plate 15 by diffusion and the deposition of a film is prevented. In this manner, the aging change of the transmission characteristic of the glass plate is prevented.

An embodiment for monitoring the W wafer is identical to that which uses the compensation means.

The method of the present embodiment is applicable to not only the RF discharge plasma but also to a DC discharge plasma and a microwave discharge plasma.

Figure 9:
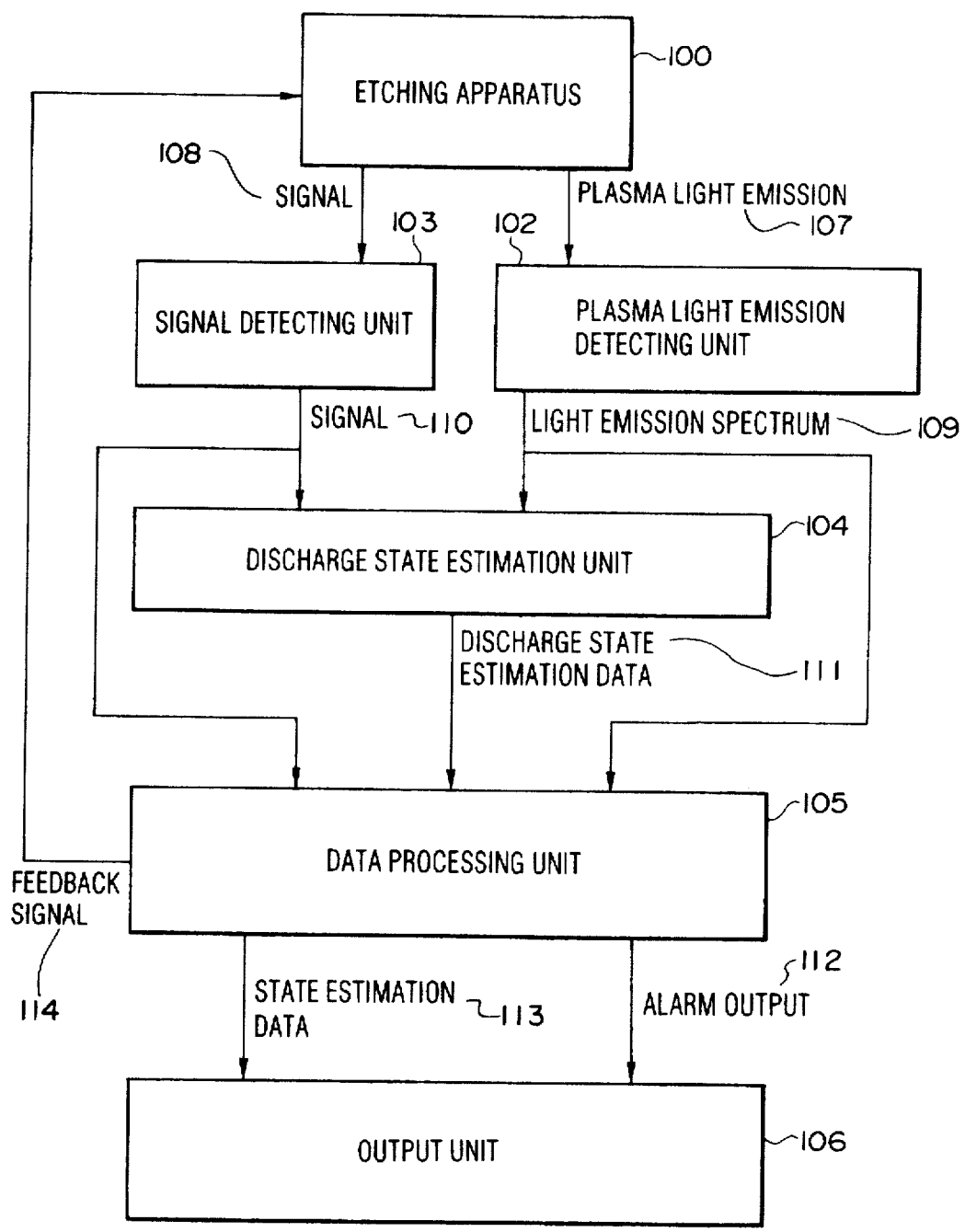
FIG. 9 shows a conceptual view of another embodiment of the present invention.

An embodiment of the present invention is described below. FIG. 9 shows a conceptual view of the plasma process monitor by using the etching apparatus of the present invention. The plasma process monitor comprises a plasma light emission detection unit 102, a signal detection unit 103, a discharge state estimation unit 104, a data processing unit 105 and an output unit 106. Operations of the respective units are briefly explained below. The plasma light emission detection unit 102 determines a light emission spectrum data 109 based on the plasma light emission 107 of the etching apparatus 101 and sends it to the discharge state estimation unit 104 and the data processing unit 105. The signal detection unit 103 receives a signal 108 relating to a potential of a substrate to be processed and setting of the process conditions as an input and sends a digitized signal 110 to the discharge state estimation unit 104 and the data processing unit 105. The discharge state estimation unit 105 estimates the discharge condition based on the supplied data and sends discharge condition estimation data 111 to the data processing unit 105. The data processing unit 105 estimates the amount and the state of the reaction product in the processing chamber of the etching apparatus 101 and the state of deterioration of components based on the signal 110 and the light emission spectrum data 109 and sends them to the output unit 106 as the information on the maintenance of the apparatus and an error alarm (state estimate data 113 and alarm output 112) to display the data. Setting conditions such as a processing pressure, gas flow rate and a plasma generation power to compensate for the shift from the predetermined etching process characteristic are determined and they are sent to the etching apparatus 101 as a feedback signal 114. The etching apparatus 101 changes the setting conditions in accordance with the supplied feedback signal 114 to compensate for the shift from the predetermined etching characteristic.

Major units are now explained in detail. The discharge state estimation unit is first explained. In the plasma processing apparatus, the apparatus is usually deteriorated as the process proceeds and the maintenance such as the cleaning and the replacement of the components is required. The set process conditions may differ from the effective process conditions in the processing chamber as the components are deteriorated. For example, the flow rate of the processing gas is normally controlled by the unit called a mass flow controller to attain a predetermined flow rate. The mass flow controller comprises a flow rate measurement unit and a flow rate control unit. Usually, the flow rate measurement unit of the mass flow controller branches the gas flow path to a small conductance flow path (flow path 1) for measuring the flow rate and a large conductance flow path (flow path 2). A total flow rate can be exactly controlled if a ratio of the conductances of the flow path 1 and the flow path 2 does not change, but if a foreign material is introduced in one of the flow paths, the ratio of conductances of the flow path 1 and the flow path 2 changes and the processing gas is supplied at a flow rate different from the predetermined rate.

In the etching apparatus 101, the items to be estimated by the discharge state estimation unit 104, the signal 110 and the light emission spectrum data 109 are simultaneously estimated and they are retained as a database. By using the database, the discharge state may be estimated when only the signal 101 and the light emission spectrum data are known. For example, the prediction of the plasma generation power is described. In the etching apparatus 101, the plasma generation power, the signal 101 and the light emission spectrum data 109 are measured. For the magnitudes of different plasma generation powers, the measurement is made a plurality of times and the derived data are used as the database. By repeating the measurement a sufficient number of times, the data occupy a certain area in the signal space. If the number of times of measurement is small, the data are interpolated by the linearization or assuming an appropriate function to determine the area in the signal space. If the plasma generation power is not known, only the signal 101 and the light emission spectrum data 109 are available as known data. The data is displayed in the signal space to derive a line. A plasma generation power on a point on the line which has a minimum distance from the point in the database area is assumed as a predicted value. When there are a plurality of items to be predicted, the prediction values may be determined in the same manner. As a definition of the distance between two points in the signal space, a square sum of differences of coordinates of the respective axes, a sum of absolute values of differences or a positive weighted sum of square of differences may be used.

By using the data retained as the database, a plurality of different apparatus having the same construction may be compared. The database acquired by the etching apparatus to be compared (hereinafter referred to as a compared apparatus) is compared with the database of the etching apparatus which is a reference for comparison (hereinafter referred to as a reference apparatus). Usually, the database of the reference apparatus and the database of the compared apparatus occupy different areas in the signal space. The reason for the different areas may be considered as a measurement error and a difference between the reference apparatus and the compared apparatus. Thus, the respective axes to be estimated are parallelly moved and contracted or expanded to absorb the difference between the databases in the signal spaces of the reference apparatus and the compared apparatus. By using the parameters representing the parallel movement and the contraction/expansion of the axes to be estimated, the difference between the reference apparatus and the compared apparatus may be quantified.

For example, it is assumed that only the plasma generation power is an item to be estimated. The data-base of the reference apparatus and the data-base of the compared apparatus are compared. Vectors of points constituting the data-bases of the reference apparatus and the compared apparatus are represented by $F^S(w_i)$ and $F^C(w_i)$, respectively, where $w_i$ ($i=1\sim N$) is the plasma generation power at each point of the data-base. A function for determining a distance is represented by d. Now, a and b which minimize $$S = \sum_{i=1}^{N} d(F^S(w_i) - F^C(aw_i + b))$$

is determined to evaluate a degree of difference between the reference apparatus and the compared apparatus. By using the above a and b, the discharge state estimation data 111 or the signal 110 is converted so that the discharge state data of the compared apparatus may be calibrated relative to the standard apparatus. As the definition of distance, square sum of differences of coordinates on the respective axes, sum of absolute values of differences or weighted sum of squares of differences may be used. When there are a plurality of items to be estimated, the compared apparatus may be calibrated with reference to the reference apparatus in a similar manner.

An embodiment for structuring the data-base is now explained. In order to attain speed data processing, it is desirable that the data-base is as small as possible. Usually, the peak appearing in the plasma light emission spectrum not only changes with the discharge conditions (plasma generation power, pressure, gas flow rate, etc.) but also some are independent from those changes. The peak (wavelength) which is independent from the discharge conditions cannot be effectively used as the data-base. Accordingly, those data are eliminated from the data-base to reduce the data-base. A method for discriminating the effective data and the ineffective data is explained below.

A method for preparing a data-base which depends on the plasma generation power is explained below. In order to prepare the data-base, the plasma light emission spectrum when the plasma generation power is changed is sampled. The light emission spectrum is sampled several times for one plasma generation power while the plasma generation power is changed at random. Namely, the light emission spectra are sampled in the sequence shown in Table 1. In Table 1, a total of 90 data with nine plasma generation powers and ten times of repetition are sampled. Numerals in Table 1 represent the sequence of measurement. The light emission spectra thus measured are rearranged relative to a peak of a given wave-length as shown in Table 2. Accordingly, as many Tables 2 as the number of wavelengths are prepared. In Table 2, vertical columns represent results of repetitive measurement with the same plasma generation power, and horizontal rows represent results corresponding to the change in the plasma generation power. In Table 2, dispersion for each column (hereinafter referred to as a column dispersion) and a dispersion for each row (hereinafter referred to as a row dispersion) are added. Those represent variations by the repetitive measurements and variations by the change in the plasma generation power. If the row dispersion is in substantially same as the column dispersion, it may be said that the light emission intensity at that wave-length does not correspond to the plasma generation power. Accordingly, when the data-base is structured by only those wave-lengths which have a sufficiently larger row dispersion than the column dispersion, the data may be effectively utilized. The gas flow rate dependent data-base and the pressure dependent data-base may be prepared in a similar manner.

TABLE 1

| Repetition | Plasma generation power | | | | | | | | |
|---|---|---|---|---|---|---|---|---|---|
| | $W_1$ | $W_2$ | $W_3$ | $W_4$ | $W_5$ | $W_6$ | $W_7$ | $W_8$ | $W_9$ |
| 1 | 6 | 2 | 5 | 1 | 4 | 3 | 7 | 9 | 8 |
| 2 | 10 | 17 | 12 | 11 | 15 | 16 | 13 | 18 | 14 |
| 3 | 24 | 23 | 19 | 21 | 27 | 20 | 22 | 26 | 25 |
| 4 | 32 | 31 | 34 | 29 | 35 | 33 | 30 | 36 | 28 |
| 5 | 42 | 43 | 39 | 40 | 38 | 45 | 41 | 44 | 37 |
| 6 | 53 | 46 | 47 | 52 | 48 | 49 | 54 | 50 | 51 |
| 7 | 60 | 55 | 56 | 61 | 57 | 58 | 59 | 62 | 63 |
| 8 | 64 | 67 | 70 | 68 | 66 | 69 | 72 | 71 | 65 |
| 9 | 75 | 81 | 73 | 80 | 74 | 78 | 76 | 79 | 77 |
| 10 | 86 | 87 | 82 | 90 | 84 | 83 | 89 | 85 | 88 |

TABLE 2

| Repetition | Plasma generation power | | | | | |
|---|---|---|---|---|---|---|
| | $W_1$ | $W_2$ | $W_3$ | ... | $W_9$ | Spread along row |
| 1 | $y_{11}$ | $y_{12}$ | $y_{13}$ | | $y_{19}$ | $\sigma_1{}^*$ |
| 2 | $y_{21}$ | $y_{22}$ | $y_{23}$ | | $y_{29}$ | $\sigma_2{}^*$ |
| 3 | $y_{31}$ | $y_{32}$ | $y_{33}$ | | $y_{39}$ | $\sigma_3{}^*$ |
| . | | | | | | |
| . | | | | | | |
| . | | | | | | |
| 10 | $y_{101}$ | $y_{102}$ | $y_{103}$ | | $y_{109}$ | $\sigma_{10}{}^*$ |
| Dispersion along column | $\sigma_1$ | $\sigma_2$ | $\sigma_3$ | | $\sigma_9$ | |

$$\sigma_j = \sqrt{\frac{1}{9} \sum_{i=1}^{10} (Y_{ij} - \bar{y}_j)^2}$$

$$\bar{y}_j = \frac{1}{10} \sum_{i=1}^{10} y_{ij}$$

$$\sigma_i{}^* = \sqrt{\frac{1}{8} \sum_{j=1}^{9} (y_{ij} - \bar{y}_i{}^*)^2}$$

$$\bar{y}_i{}^* = \frac{1}{9} \sum_{j=1}^{9} y_{ij}$$

The data processing unit is now explained. In the data processing unit, relations between events such as the occurrence of failure in the components, the high necessity of cleaning or the necessity of replacement of the components of the etching apparatus 101, the light emission spectrum data 109, the discharge state estimation data 111 and the signal 110 are described by logical expressions to predict the occurrence of each of the events based on the input data. For example, in the light emission spectrum data 109, when the light emission at 777 nm indicates increase from the previous discharge at more than a predetermined rate and the pressure in the processing chamber when the processing gas is not introduced indicates increase from the previous at more than a predetermined rate, it is doubted the oxygen may have been introduced into the processing chamber and an alarm output is issued to alarm the leakage in the processing chamber. When the gas flow rate estimated based on the gas flow rate setting and the light emission spectrum data 109 is larger than a predetermined rate and the amount of evacuation of the vacuum pump for evacuating the processing chamber increases, it is predicted that the control unit for the gas flow rate has failed and an alarm is issued. A binary logic or a fuzzy logic may be used.

Figure 10:
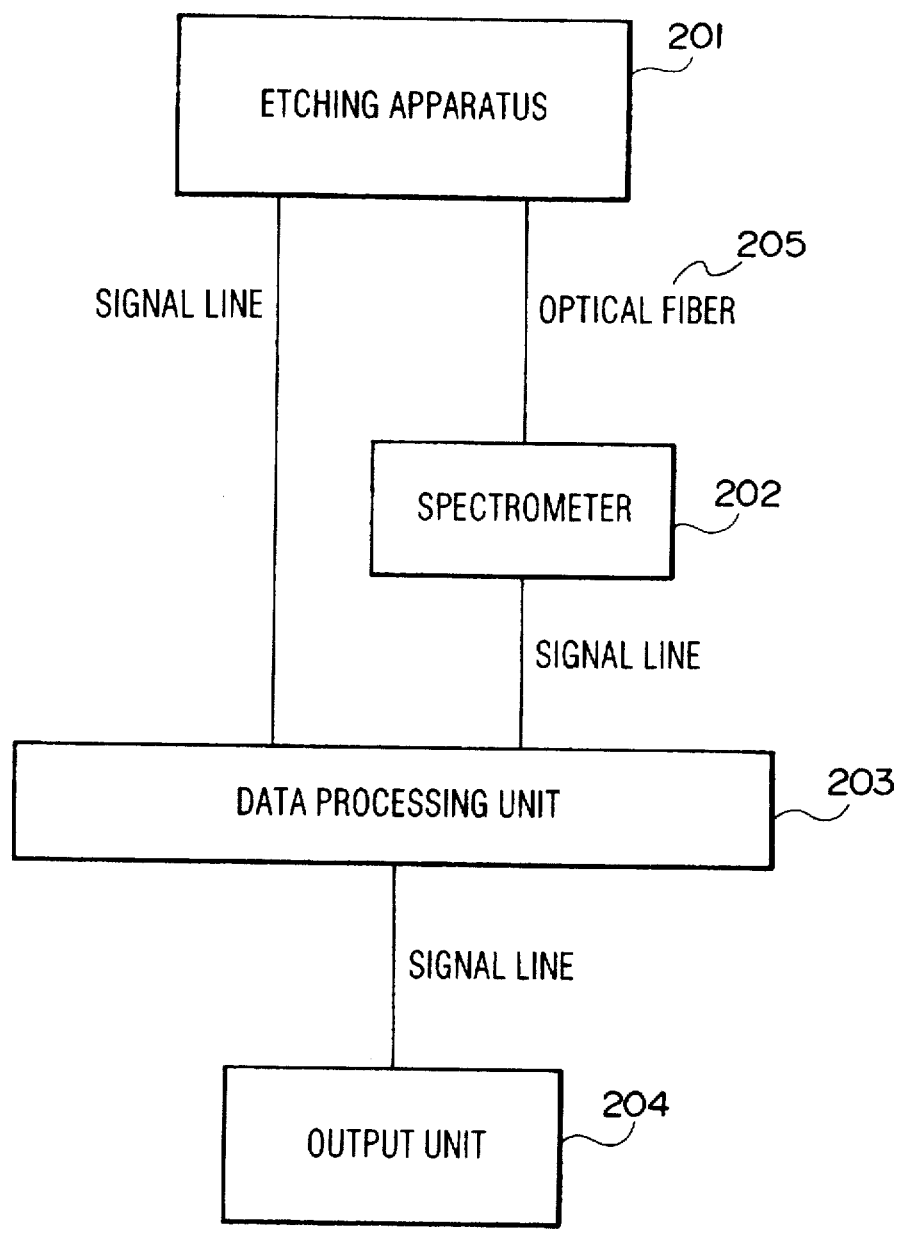
FIG. 10 shows a hardware configuration of other embodiment of the present invention.
Figure 11:
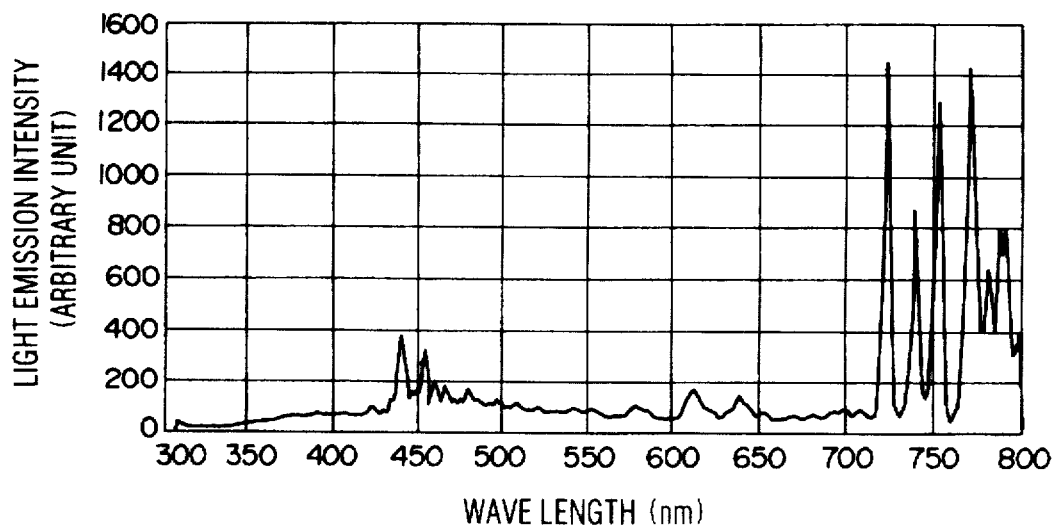
FIG. 11 shows a light emission spectrum in a non-contaminated processing chamber.
Figure 12:
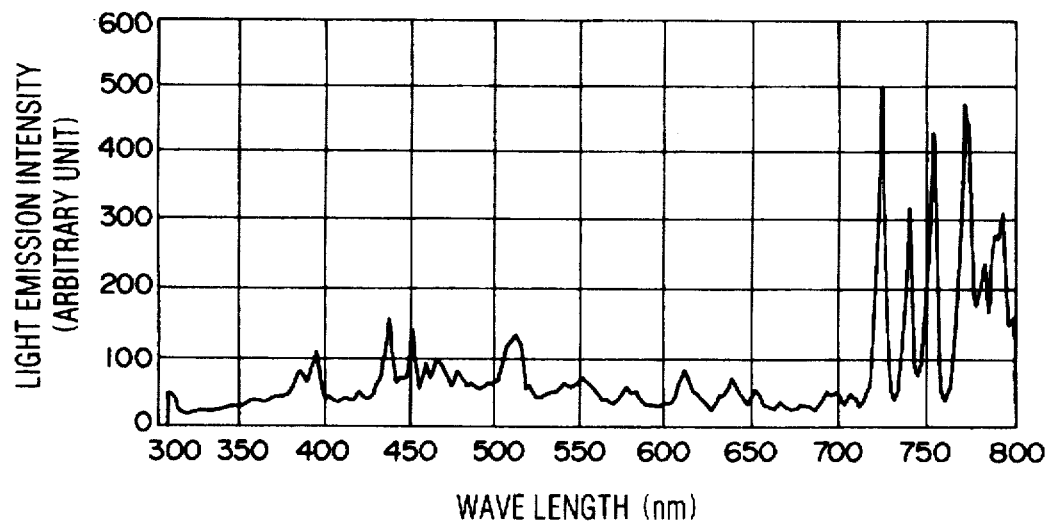
FIG. 12 shows a light emission spectrum in a contaminated processing chamber.
Figure 13:
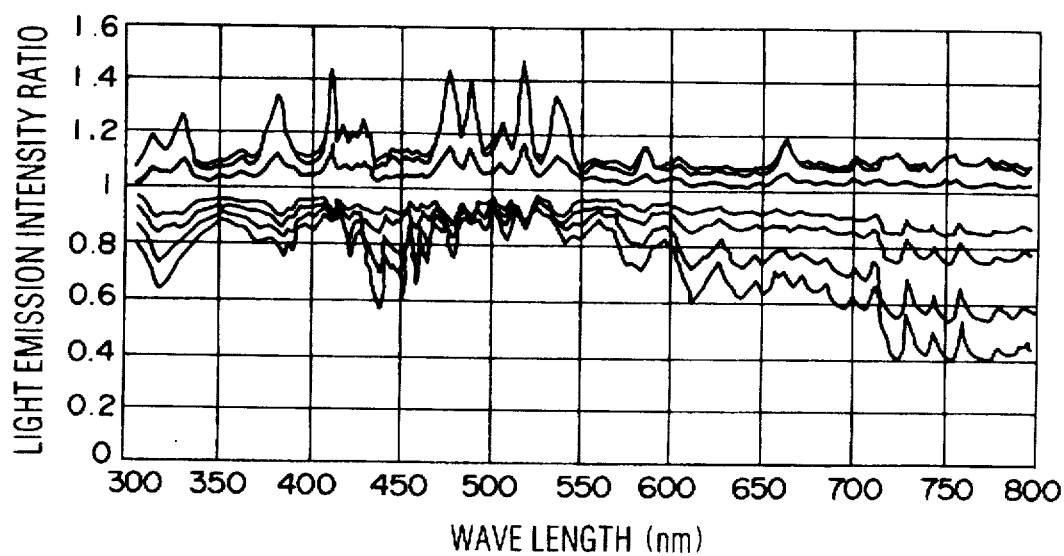
FIG. 13 shows a change of the light emission spectrum by a change of a discharge power.
Figure 14:
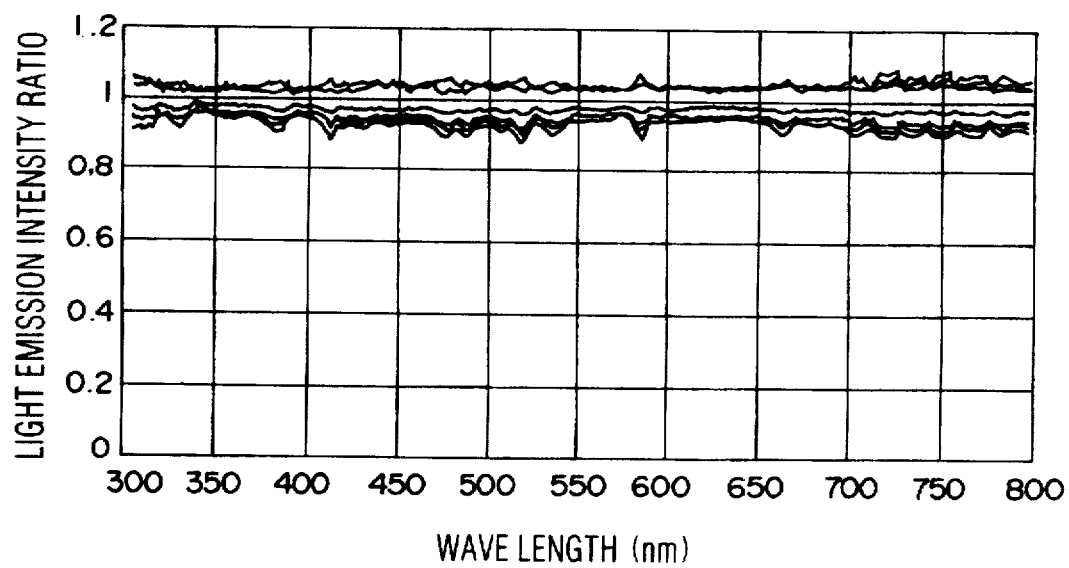
FIG. 14 shows a change of the light emission spectrum by the change of the discharge power.
Figure 15:
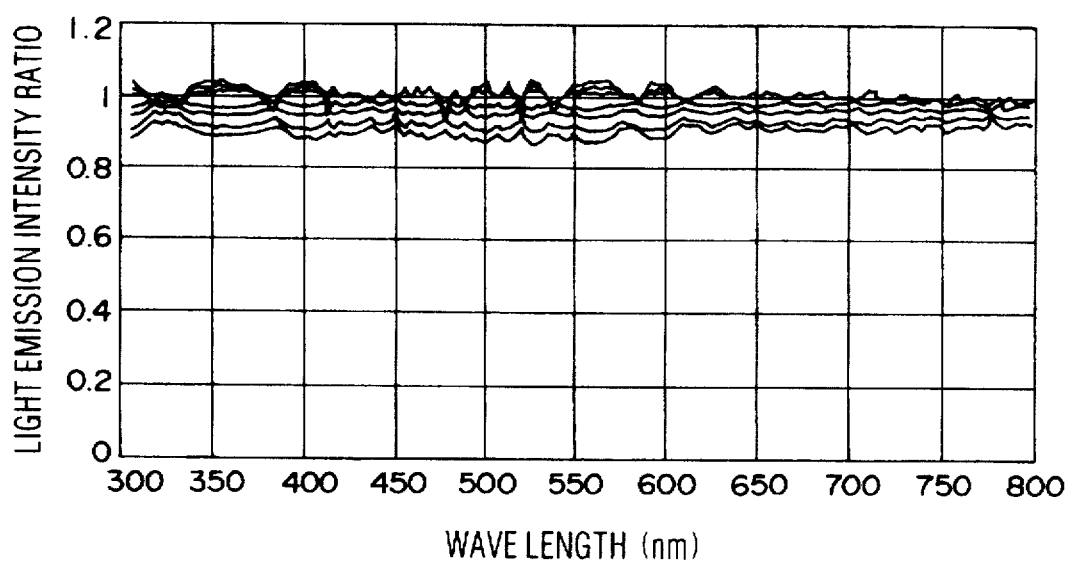
FIG. 15 shows a change of the light emission spectrum by the change of a gas flow rate.

FIG. 10 shows a hardware configuration of the plasma processing monitor. The optical fiber 205 is connected to the window of the etching apparatus 201 for sampling the plasma light emission, and the plasma light emission is directed to the spectrometer 202. The spectrometer 202 transmits the light emission spectrum data to the data processing apparatus by using a signal line. The etching apparatus 201 and the data processing apparatus 203 are connected through a signal line and the signal 108 and the feedback signal 114 shown in FIG. 9 are exchanged. The output unit 204 is connected to the data processing unit 203 and the state estimation data 113 and the alarm output 112 shown in FIG. 1 are transmitted.

Figure 21:
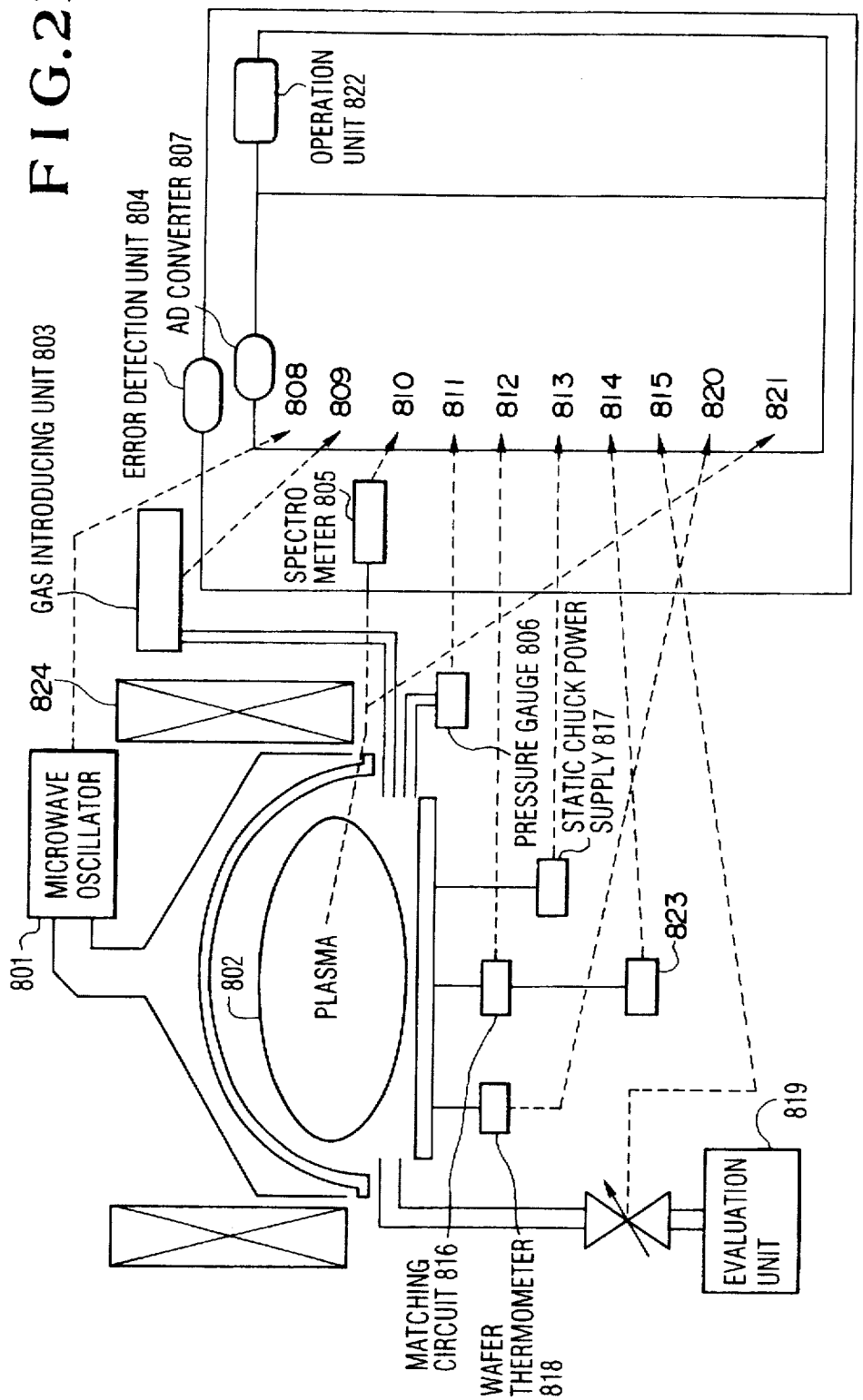
FIG. 21 shows a configuration of a dry etching apparatus in accordance with the present invention.
Figures 22, 23:
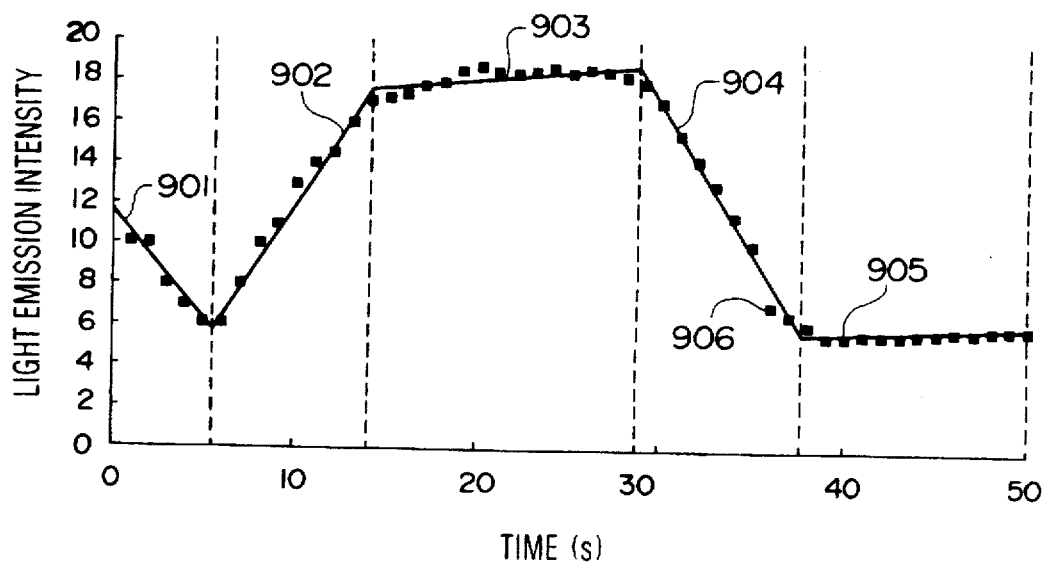
FIG. 22 shows a change in time of light emission of a material to be etched in the dry etching apparatus.
FIG. 23 is a diagram showing a relation between parameter and the probability of normal range.

Referring to FIGS. 21 and 22, an embodiment of the present invention is explained. FIG. 21 shows a dry etching apparatus using the present invention.

Usually, in order to detect an apparatus error, it is necessary to define a normal apparatus state and a range thereof. The normal apparatus state is referred to as a reference state. A current state is compared with the reference state to determine normal or error. FIG. 21 shows the etching apparatus using the present invention. The following items are converted to digital data by an AD converter 807 as the apparatus state and they are analyzed by an operation unit 822 to detect any apparatus error.

(1) microwave input reflection power 808
(2) gas flow rate 809
(3) plasma light emission spectrum 810
(4) processing chamber pressure 811
(5) matching state of RF matching circuit 812
(6) static chuck voltage and current 813
(7) RF input reflection power 814
(8) pressure regulator valve aperture 815
(9) wafer temperature 820
(10) coil voltage and current 821

The operation unit 822 maintains those apparatus states and may take out the apparatus states when the error is detected or at any time. Past apparatus states may be used to analyze the cause of error or manage the apparatus.

Items representing a number of apparatus states are recorded over an period and a mean value and a standard deviation of the apparatus state may be determined based on those data. If the apparatus state is near the average value, it is determined normal, and if it is distant, it is determined abnormal. Whether it is close to or distant from the average value, that is, the threshold for determining the error may be determined with reference to the standard deviation. The average value and the standard deviation may be determined based on the number of data, a total sum of data and a square sum of data.

One of the following two methods may be used to set the reference state.

(1) use an average value and a standard deviation determined for a given section (2) update the average value and the standard deviation each time new data is sampled In another method for determining a normal operation state of the apparatus, a center value and a most frequent value in a frequency distribution, in addition to the average value, may be used. Variance of the operation state may be used in place of the standard deviation and the dispersion, a range of maximum and minimum and an absolute deviation may be used.

A procedure for determining the reference state for the plasma light emission spectrum of the apparatus states is explained below. The change in time of the plasma light emission is approximated by segments for each of the time domains and the characteristic of the change may be represented by using the coordinates of end points of the segments. The number of time domains (the number of segments used for the approximation) may be determined by the pattern of change in time. For the change in time of the light emission of the material to be etched in the etching process, it is appropriate to approximate by five segments.

A method for approximating the change in time of the plasma light emission by a plurality of segments is explained below. FIG. 22 shows a change in time of the light emission of the material to be etched. Normally, the change in time of the material to be etched may be divided into five areas as shown in FIG. 22 and the change in time may be approximated by five segments. A segment approximation algorithm is described below.

(1) Initial values ($T_1'$~$T_6'$) of time boundaries of respective areas are determined based on peak and valley of two-stage differentiation of the light emission intensity and start and end of the process, where $T_i'<T_{i+1}'$ (i= 1~5). $T_1'$ is a start time of the process, $T_6'$ is an end time of the process, $T_2'$ and $T_3'$ are first half peak and valley, respectively, and $T_4'$ and $T_5'$ are second half peak and valley, respectively.

(2) Linearly approximate by the minimum square method in the section ($T_1'$~$T_{i+1}'$)

(3) Determine $T_1$~$T_6$ from the crosspoints of segments and the start and end times of the process, where $T_i<T_{i+1}$ (i=1~5), $T_1$ (=$T_1'$) is the start time of the process, $T_6$ (=$T_6'$) is the end time of the process, $T_{i+1}$ is a X coordinate of a crosspoint of a segment determined by the minimum square method in ($T_i$~$T_{i+1}'$) and a segment determined by the minimum square method in ($T_{i+1}'$~$T_{i+2}'$), where i=1, 2, 3, 4.

(4) Substitute $T_1$~$T_6$ by $T_1'$~$T_6'$.

(5) Determine conversion, and if not converged, return to (2).

The coordinates of the line segments derived from the above algorithm represents a characteristic of the change in time. The end points of those line segments are referred to as characteristic points. In the above algorithm, the step for determining the times of peak and valley of the two-stage differentiation may be omitted by using appropriate initial values. For example, as the initial values, the time of the characteristic point relating to the substrate processed immediately before may be used.

The length of the time domain and the light emission intensity of the characteristic point may be determined based on the coordinates of the characteristic point. An average value and a standard deviation may be determined for the length of the time domain and the light emission intensity of the characteristic point.

A deviation from the line approximation is processed in the following procedure. Each of the time domains in which the segment approximation is made is compressed, expanded and normalized to align it in time. For each normalized time, an average value and a standard deviation are determined.

Changes in time of other items representing the apparatus states may be represented by the approximated segments and the deviations from the segment approximation by using a similar method. The data is processed for each substrate to be processed to determine the average value and the standard deviation. For each item to be measured, the followings are derived.

(1) an average value of a length of each of the segment-approximated time domains (2) an average value and a standard deviation of a height of each characteristic point (3) an average value of deviations from the segment approximation in each of the segment approximated time domains and a standard deviation An operation algorithm of the error detection unit is as follows.

(1) Sample apparatus states (2) Model the apparatus states by segment approximation (3) Update the reference state and a range thereof (4) Compare a current apparatus state with the reference apparatus state by taking the range of the reference state into consideration to determine an apparatus error (5) If the apparatus error is detected, proceed to (6). If normal, return to (1).

(6) Output the current apparatus state, the reference state and the range thereof. Determine a degree of apparatus error, and if it is a significant error, stop the apparatus. If it is a light error, issue an alarm and return to (1)

In the above algorithm, the steps (3) and (4) may be reversed.

A method for determining the apparatus error and a method for evaluating a degree of apparatus error are explained below. For each item of the apparatus states, a plurality of average values and standard deviations are derived. For each average value and standard deviation, a normal range is defined as follows.

$$[\bar{X}-k\sigma, \bar{X}+k\sigma]$$

where $\bar{X}$ is an average value, $\sigma$ is a standard deviation and k is a constant. The value of k is determined by taking an error occurrence rate for the parameter into consideration. It is known that when a number of data are collected, the frequency distribution thereof usually approaches a normal distribution. When the above parameters are normally distributed, a probability that the value of k is in the normal range when the parameter is observed is given by FIG. 23.

The value of k is determined for each parameter and the normal or abnormal state of the parameter is determined. The errors are classified depending on the error parameters and the degree of deviation from the standard deviation to determine the degree of apparatus error and the content of the error.

In accordance with the present invention, the etching process of the wafer in the plasma etching apparatus is continuously monitored to maintain the process characteristic constant so that the occurrence of error is prevented.

What is claimed is:

1. A plasma processing method for a plasma processing apparatus, comprising the steps of:
   detecting a light emission of a plasma generated in a plasma processing chamber and a light of a known spectrum emitted from a light source external of said plasma processing chamber and transmitted through said plasma processing chamber;
   determining a difference between a spectrum of the light emission of the plasma and a spectrum of the light of the known spectrum after being transmitted through said plasma processing chamber;
   determining an internal state of said plasma processing chamber based on the difference of the spectra; and
   controlling a setting condition of said processing apparatus to control a plasma characteristic within said plasma processing chamber based on said internal state.

2. A plasma processing method as claimed in claim 1, wherein said controlling step more specifically controls a plasma characteristic within said plasma processing chamber to be substantially constant based on said internal state from said determining step.

3. A plasma processing method as claimed in claim 1, wherein said controlling step more specifically controls at least one of a processing pressure, a gas flow rate and a plasma generation power to control said plasma characteristic.

4. A plasma processing method for a plasma processing apparatus, comprising the steps of:
   detecting the plasma light emission of a plasma generated in a plasma processing chamber through a window and a light of a known spectrum emitted from a light source external of a plasma processing apparatus and transmitted through a same said window of the plasma processing apparatus;
   determining a difference between a spectrum of the plasma light emission and a spectrum of the light of the blown spectrum and determining an internal state of the plasma processing chamber based on the difference of the spectrum; and
   controlling a setting condition of said processing apparatus to control a plasma characteristic within said plasma processing chamber based on said internal state.

5. A plasma processing method according to claim 4, further comprising the step of controlling a condition of the plasma to maintain a spectrum of the detected light emission of the plasma substantially constant.

6. A plasma processing apparatus for plasma processing a wafer comprising:
   a light source of a known spectrum;
   a sampling window for sampling a plasma light emission;
   an optical system for directing a light through said sampling window and a processing chamber;
   an optical system for directing a light not through said processing chamber;
   a spectrometer for analyzing a spectrum; and
   a controller;
   wherein an internal state of said sampling window is detected based on a difference between spectra of the lights emitted from said light source derived by said spectrometer through said optical systems, and an internal state of said processing chamber is detected based on the detected internal state of said sampling window; and
   said controller controlling a setting condition of said processing apparatus to control a plasma characteristic within said processing chamber based on said internal state.

7. A plasma processing apparatus for processing a wafer by plasma comprising:
   a processing chamber having a sampling window for sampling a plasma light emission; and
   a reference light source external to said processing chamber for shining a reference light through said processing chamber and said sampling window;
   means for comparing the plasma light emission and reference light sampled through said sampling window to detect an internal state of said processing chamber; and
   a controller controlling a setting condition of said processing apparatus to control a plasma characteristic within said processing chamber based on said internal state.

8. A plasma processing apparatus for processing a wafer by plasma comprising:
   a processing chamber having a sampling window for sampling a plasma light emission; and
   a reference light source external to said processing chamber for shining a reference light through said processing chamber and said sampling window;
   means for comparing the plasma light emission and reference light sampled through said sampling window to detect an internal state of said processing chamber; and
   means for controlling a processing condition of said processing apparatus based upon said internal state to maintain a spectrum of the plasma through said sampling window substantially constant.

9. A plasma processing apparatus according to claim 7 wherein an effective value of a setting condition of processing is estimated based on a result of monitoring of said internal state.

10. A plasma etching method for a plasma etching apparatus, comprising the steps of:
    detecting a light emission of a plasma generated in a plasma etching chamber and a light of a known spectrum emitted from a light source external of said plasma etching chamber and transmitted through said plasma etching chamber;
    determining a difference between a spectrum of the light emission of the plasma and a spectrum of the light of the known spectrum after being transmitted through said plasma etching chamber;
    determining an internal state of said plasma etching chamber based on the difference of the spectra; and
    controlling a setting condition of said processing apparatus to control a plasma characteristic within said plasma etching chamber based on said internal state.

11. A plasma etching apparatus for processing a wafer by plasma comprising:
    a processing chamber having a sampling window for sampling a plasma light emission; and
    a reference light source external to said processing chamber for shining a reference light through said processing chamber and said sampling window;
    means for comparing the plasma light emission and reference light sampled through said sampling window to detect an internal state of said processing chamber; and
    a controller controlling a setting condition of said processing apparatus to control a plasma etching characteristic within said processing chamber based on said internal state.

12. A plasma etching apparatus as claimed in claim 11, wherein said controller more specifically controls said plasma etching characteristic within said processing chamber to be substantially constant based of said internal state detected by said means for comparing.

13. A plasma etching apparatus as claimed in claim 11, wherein said controller more specifically controls at least one of a processing pressure, a gas flow rate and a plasma generation power to control said plasma etching characteristic.

14. A plasma processing apparatus comprising:

a processing chamber having a substrate to be processed arranged therein and maintaining processing gas at a predetermined pressure and having at least a pair of opposing windows to allow observation of the interior thereof;

plasma generation means for generating a plasma in said processing chamber having the processing gas maintained at the predetermined pressure;

plasma light emission monitor means arranged externally of said processing chamber for monitoring the light emission of the plasma through one of said pair of opposing windows;

reference light irradiation means for irradiating a reference light to said plasma light emission monitoring means from that window of said pair of opposing windows which is opposite to said plasma light emission monitoring means and through said processing chamber using said pair of opposing windows; and control means for controlling a setting condition of said plasma processing apparatus to control a plasma characteristic within said processing chamber based on a comparison of the data on the light emission of the plasma and the reference light as monitored by said plasma light emission means.

* * * * *